(12) United States Patent
Kondo et al.

(10) Patent No.: US 9,966,870 B2
(45) Date of Patent: May 8, 2018

(54) POWER CONVERSION DEVICE AND DRIVE DEVICE

(71) Applicant: Renesas Electronics Corporation, Tokyo (JP)

(72) Inventors: Daisuke Kondo, Tokyo (JP); Koji Tateno, Tokyo (JP); Chang Liu, Tokyo (JP); Nao Nagata, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/168,031

(22) Filed: May 28, 2016

(65) Prior Publication Data
US 2017/0012551 A1    Jan. 12, 2017

(30) Foreign Application Priority Data

Jul. 7, 2015 (JP) ................................ 2015-136132

(51) Int. Cl.
*H02M 5/458* (2006.01)
*H02M 1/08* (2006.01)
(Continued)

(52) U.S. Cl.
CPC .......... *H02M 5/458* (2013.01); *H01L 29/00* (2013.01); *H02M 1/08* (2013.01); *H03K 17/127* (2013.01);
(Continued)

(58) Field of Classification Search
CPC ...... H02M 5/458; H02M 1/08; H03K 17/567; H03K 17/7955; H03K 17/127; H03K 17/168; H03K 17/691; H01L 29/00
See application file for complete search history.

(56) References Cited

U.S. PATENT DOCUMENTS 8,093,852 B2 *   1/2012   Nakamura .......... B60L 11/1868
                                                318/471
8,284,575 B2 *  10/2012   Inamura .................. H02M 1/08
                                                318/800
(Continued)

FOREIGN PATENT DOCUMENTS

JP      2012-256839 A     12/2012
JP      2013-140885 A      7/2013
WO    WO 2004/012326 A1    2/2004

OTHER PUBLICATIONS

Extended European Search Report dated May 9, 2017.

*Primary Examiner* — Timothy J Dole
*Assistant Examiner* — Sisay G Tiku
(74) *Attorney, Agent, or Firm* — McGinn IP Law Group, PLLC

(57) ABSTRACT

To reduce the number of mounted components in the power conversion device and drive device.

Each high-side transistor and low-side transistor has an EGE-type structure of (emitter-gate-emitter type). A high-side driver includes a first pull-up transistor configured to apply a first positive voltage to a gate based on an emitter of the high-side transistor, and a first pull-down transistor configured to couple the gate to the emitter. A low-side driver includes a second pull-up transistor configured to apply a second positive voltage to the gate based on an emitter of the low-side transistor, and a second pull-down transistor configured to couple the gate to the emitter.

19 Claims, 12 Drawing Sheets

(51) Int. Cl.
  *H03K 17/567* (2006.01)
  *H02K 17/12* (2006.01)
  *H02K 17/16* (2006.01)
  *H01L 29/00* (2006.01)
  *H03K 17/12* (2006.01)
  *H03K 17/691* (2006.01)
  *H03K 17/795* (2006.01)
  *H03K 17/61* (2006.01)
  *H03K 17/16* (2006.01)

(52) U.S. Cl.
  CPC .......... *H03K 17/567* (2013.01); *H03K 17/61* (2013.01); *H03K 17/691* (2013.01); *H03K 17/7955* (2013.01); *H03K 17/168* (2013.01); *H03K 2217/0081* (2013.01)

(56) References Cited

U.S. PATENT DOCUMENTS

| | | | | |
|---|---|---|---|---|
| 8,848,408 | B2* | 9/2014 | Shindo | B60L 3/0007 180/279 |
| 9,729,042 | B2* | 8/2017 | Miyauchi | H02M 1/08 |
| 2004/0017227 | A1* | 1/2004 | Hiyama | H02M 7/5387 327/108 |
| 2011/0058400 | A1* | 3/2011 | Fukuta | H02M 1/084 363/131 |
| 2011/0080149 | A1* | 4/2011 | Fukuta | H02M 1/36 323/284 |
| 2011/0221370 | A1* | 9/2011 | Fukuta | H02M 1/32 318/400.27 |
| 2012/0134181 | A1* | 5/2012 | Amano | H02M 7/497 363/21.12 |
| 2012/0292662 | A1 | 11/2012 | Matsuura et al. | |
| 2013/0039097 | A1* | 2/2013 | Watanabe | H02M 1/44 363/21.01 |
| 2013/0175574 | A1* | 7/2013 | Matsuura | H01L 29/66348 257/139 |
| 2014/0092653 | A1* | 4/2014 | Suzuki | H02M 1/08 363/55 |
| 2014/0307495 | A1* | 10/2014 | Fukuta | H02H 3/08 363/98 |
| 2015/0085538 | A1* | 3/2015 | Miyauchi | H02M 1/084 363/21.17 |
| 2015/0303288 | A1* | 10/2015 | Hashimoto | H01L 29/7397 363/131 |
| 2015/0340480 | A1* | 11/2015 | Matsuura | H01L 29/7813 257/144 |
| 2016/0315184 | A1* | 10/2016 | Ishimaru | H01L 24/01 |
| 2016/0365433 | A1* | 12/2016 | Matsuura | H01L 29/7396 |
| 2017/0005185 | A1* | 1/2017 | Nagata | H01L 29/7397 |
| 2017/0018635 | A1* | 1/2017 | Tsuyuki | H01L 29/7397 |
| 2017/0033710 | A1* | 2/2017 | Muto | H02M 7/537 |
| 2017/0133483 | A1* | 5/2017 | Nagata | H01L 29/66348 |
| 2017/0154985 | A1* | 6/2017 | Matsuura | H01L 29/7397 |

* cited by examiner

POWER CONVERSION DEVICE AND DRIVE DEVICE

CROSS-REFERENCE TO RELATED APPLICATION

The present application claims priority from Japanese Patent Application No. 2015-136132 filed on Jul. 7, 2015, the content of which is hereby incorporated by reference into this application.

TECHNICAL FIELD OF THE INVENTION

The present invention relates to a power conversion device and a drive device, and for example, relates to a high-power power conversion device for including a half-bridge circuit and the like, and a drive device of the half-bridge circuit.

BACKGROUND OF THE INVENTION

A trench gate IGBT is used as a transistor with low on-resistance, and as one form thereof, an IE type trench gate IGBT using an IE (Injection Enhancement) effect is known. The IE effect means that holes are made difficult to discharge from the emitter electrode side when the IGBT is in an ON state, whereby the concentration of charges stored in the drift region is increased to reduce the on-resistance.

In the IE type trench gate IGBT, for example, Japanese Patent Application Laid-Open No. 2012-256839 (Patent Document 1) and Japanese Patent Application Laid-Open No. 2013-140885 (Patent Document 2) disclose that the active cell region connected to the emitter electrode and the inactive cell region including the floating region are alternately arranged in the cell-forming region. Patent Document 1 discloses a structure of the GG type (gate-gate type) where two trench gates arranged in order are coupled to the gate electrode in the active cell region. Patent Document 2 discloses a structure of the EGE type (emitter-gate-emitter type) where three trench gates arranged in order are coupled to the emitter electrode, the gate electrode, and the emitter electrode in this order, in the active cell region.

SUMMARY OF THE INVENTION

In the power electronics field, a power conversion device including a half-bridge circuit having a high-side transistor and a low-side transistor is widely used. The half-bridge circuit is widely used in DC/AC converters (that is, inverters), DC/DC converters, and the like. For example, a three-phase alternating current power is generated by configuring an inverter using a half-bridge circuit of three phases.

Here, for example, when the inverter is used in the high-power field such as a wind power generation system, the on-resistance of each of the transistors in the inverter is required to be lowered such that the loss of power is particularly reduced. As this transistor with low on-resistance, for example, it is beneficial to use the IE-type trench gate IGBT, as disclosed in Patent Document 1 and Patent Document 2.

On the other hand, it is known that an erroneous turn-on occurs in the half-bridge circuit. The erroneous turn-on means a phenomenon such that, for example, when the low-side transistor is turned on in the state where the high-side transistor is turned off, the high-side transistor is instantaneously turned on. When the erroneous turn-on occurs, the switching loss increases due to through-current, thereby occurring the reduction in the power conversion efficiency and the like. In addition, the erroneous turn-on more easily occurs in the high-power field. Thus, there usually arises the need to mount components for preventing such erroneous turn-on in a power conversion device, which is used specifically in the high-power field.

Embodiments described below have been made in view of the foregoing and the above and other preferred aims and novel characteristics of the present invention will be apparent from the description of the present specification and the accompanying drawings.

A power conversion device according to an embodiment of the present invention includes: a high-side transistor and a low-side transistor including an IGBT; and a high-side driver and a low-side driver configured to drive each of the high-side transistor and the low-side transistor. Each of the high-side transistor and the low-side transistor has an EGE-type structure. The high-side driver includes: a first pull-up transistor configured to apply a first voltage as a positive voltage to a gate based on an emitter of the high-side transistor; and a first pull-down transistor configured to couple the gate of the high-side transistor to the emitter. The low-side driver includes: a second pull-up transistor configured to apply a second voltage as a positive voltage to the gate based on the emitter of the low-side transistor; and a second pull-down transistor configured to couple the gate of the low-side transistor to the emitter.

According to an embodiment of the present invention, the number of the mounted components can be reduced in the power conversion device and the drive device.

BRIEF DESCRIPTIONS OF THE DRAWINGS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that members having the same function are denoted by the same reference symbols throughout all drawings for describing the embodiments, and the repetitive description thereof will be omitted.

DESCRIPTIONS OF THE PREFERRED EMBODIMENTS

First Embodiment

Overall Configuration of Power Conversion Device

Figure 1:
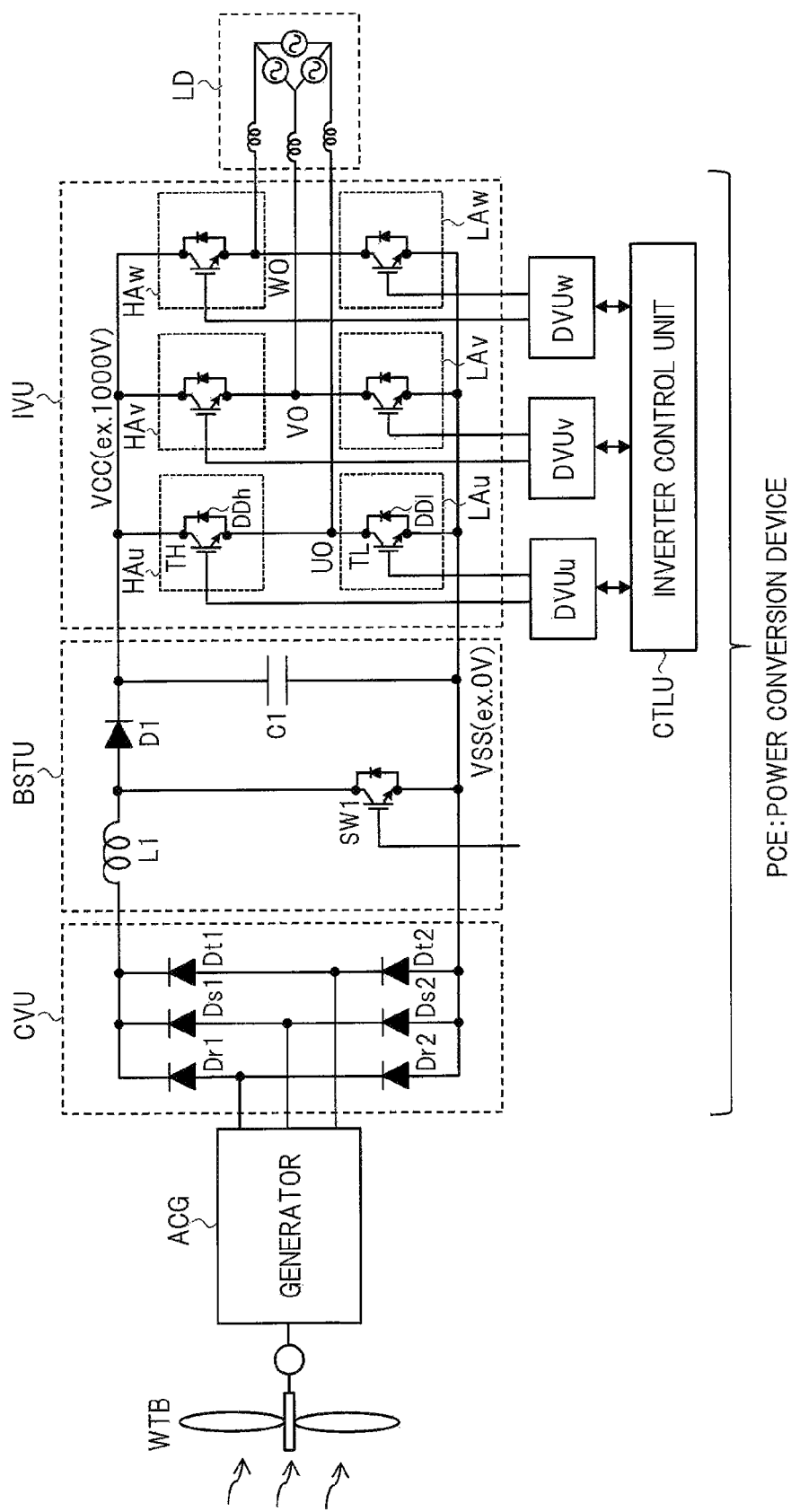
FIG. 1 is a block diagram illustrating a schematic configuration example of a wind power generation system to which a power conversion device is applied, in the power conversion device according to a first embodiment of the present invention.

FIG. 1 is a block diagram illustrating a schematic configuration example of a wind power generation system to which a power conversion device is applied, in the power conversion device according to a first embodiment of the present invention. The wind power generation system illustrated in FIG. 1 is an industrial system, and includes a wind turbine WTB, a generator ACG, a conversion unit (rectifier circuit unit) CVU, a booster circuit unit BSTU, an inverter unit IVU, three drive units (drive devices) DVUu, DVUv, and DVUw, an inverter control unit CTLU, and a load LD. Among these components, the power conversion device PCE includes, for example, a conversion unit CVU, a booster circuit unit BSTU, an inverter unit IVU, drive units DVUu, DVUv, and DVUw, and an inverter control unit CTLU.

The generator ACG generates a three-phase (R phase, S phase, and T phase) AC voltage having a voltage value such as 600 V from the power obtained by the rotation of the wind turbine WTB. The conversion unit CVU includes six diodes Dr1, Dr2, Ds1, Ds2, Dt1, and Dt2 according to the three-phase AC voltage, and converts the three-phase AC voltage into a DC voltage by full-wave rectification. The booster circuit unit BSTU includes an inductor L1, a switch SW1, a diode D1 and a capacitor C1.

The booster circuit unit BSTU boosts the DC voltage, converted by the conversion unit CVU, by using the switching of the switch SW1, thereby, for example, generating a DC voltage of 1000 V and the like (power supply voltage VCC) and holding the power supply voltage VCC in the capacitor C1. Specifically, the booster circuit unit BSTU alternately repeats the function of storing power in the inductor L1 when the switch SW1 is turned on, and the function of storing the stored power in the capacitor C1 through the diode D1 when the switch SW1 is turned off. A turning on and off of the switch SW1 is controlled by a control unit (not illustrated).

The inverter unit IVU includes high-side arms HAu, HAv, and HAw respectively corresponding to the three phases (the U phase, the V phase, and the W phase), and low-side arms LAu, LAv, and LAw respectively corresponding to the U phase, the V phase, and the W phase. The high-side arm HAu is provided between the U-phase output terminal UO and the power supply voltage VCC, the high-side arm HAv is provided between the V-phase output terminal VO and the power supply voltage VCC, and the high-side arm HAw is provided between the W-phase output terminal WO and the power supply voltage VCC. The low-side arm LAu is provided between the U-phase output terminal UO and the ground power supply voltage VSS, the low-side arm LAv is provided between the V-phase output terminal VO and the ground power supply voltage VSS, and the low-side arm LAw is provided between the W-phase output terminal WO and the ground power supply voltage VSS.

Each of the high-side arms HAu, HAv, and HAw includes a high-side transistor TH including an IGBT and the like, and a freewheeling diode DDh connected between the emitter and collector of the high-side transistor TH in reverse parallel, and including, for example, a FRD (Fast Recovery Diode) and the like. The high-side transistor TH has the emitter coupled to the output terminal of the corresponding phase and the collector coupled to the supply voltage VCC. Similarly, each of the low-side arms LAu, LAv, and LAw also includes a low-side transistor TL including an IGBT and the like, and a freewheeling diode DDl connected between the emitter and collector of the low-side transistor TL in reverse parallel, and including, for example, a FRD and the like. The low-side transistor TL has the collector coupled to the output terminal of the corresponding phase and the emitter coupled to the ground power supply voltage VSS.

The inverter unit IVU converts the DC voltage held by the capacitor C1 into the three-phase AC voltage having the predetermined voltage and frequency by the switching of the high-side transistor TH and the low-side transistor TL of each phase. The AC voltage is supplied to the load LD. The load LD is, for example, a transformer and the like that includes an inductor and the like. The drive units (drive devices) DVUu, DVUv, and DVUw respectively control the switching of the high-side transistor TH and the low-side transistor TL of the U-phase, the V-phase, and the W-phase based on the instructions from the inverter control unit CTLU. The inverter control unit CTLU includes, for example, a micro controller and the like.

Figure 2:
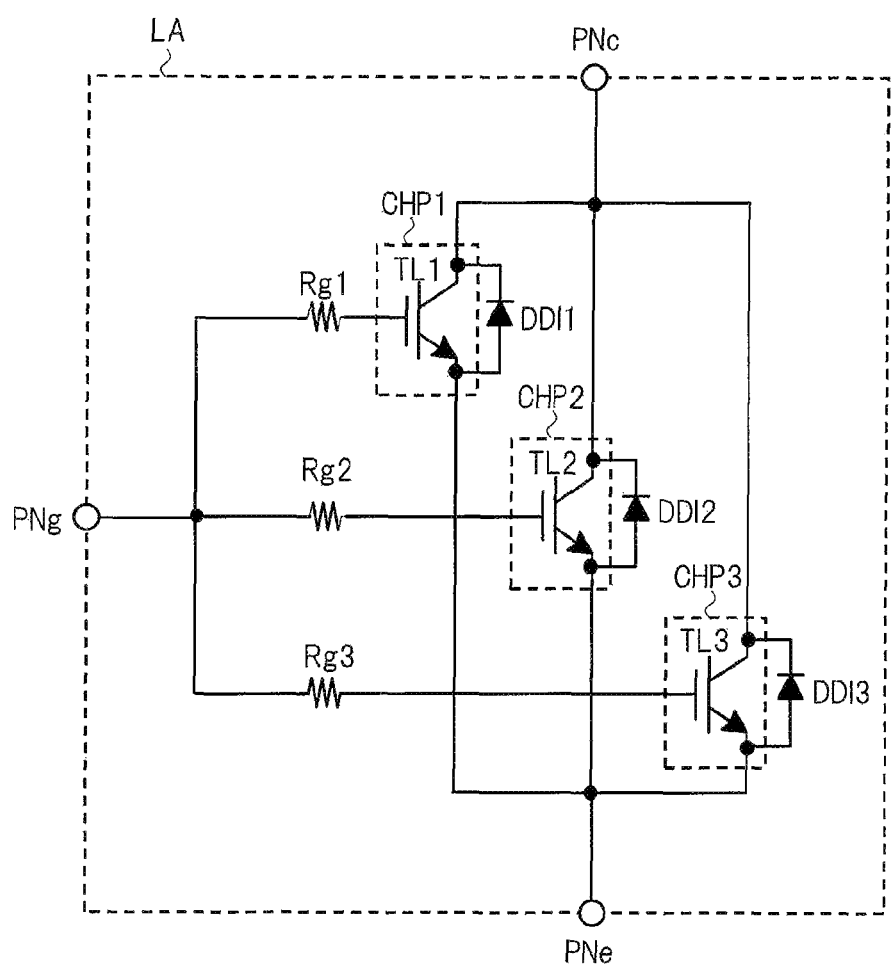
FIG. 2 is a circuit diagram illustrating a detailed configuration example of the high-side arm and the low-side arm in FIG. 1.

FIG. 2 is a circuit diagram illustrating a detailed configuration example of the high-side arm and the low-side arm in FIG. 1. Here, although the low-side arm will be described as an example, the same also applies to the high-side arm. The low-side arm LA of each phase illustrated in FIG. 1 includes, specifically, a plurality of (three in this case) low-side transistors (IGBT) TL1, TL2, and TL3, and a plurality of (three in this case) freewheeling diodes DDl1, DDl2, and DDl3 respectively connected to these transistors in reverse parallel.

The low-side transistors TL1, TL2, and TL3 are respectively constituted by three semiconductor chips CHP1, CHP2, and CHP3. In addition, the freewheeling diodes DDl1, DDl2, and DDl3 are also constituted, for example, by the respective semiconductor chips. Each of the semiconductor chips CHP1, CHP2, and CHP3 includes an emitter electrode, a collector electrode, and a gate electrode. The emitter electrodes of the semiconductor chips CHP1, CHP2, and CHP3 are coupled in common to the emitter terminal PNe, the collector electrodes are coupled in common to the collector terminal PNc, and the gate electrodes are coupled in common to the gate terminal PNg through each of the gate resistors Rg1, Rg2, and Rg3.

For example, in a system for high-power usage as illustrated in FIG. 1, there is a need for the transistor of each of the arms to supply a large current such as several hundred A or more, and 1000 A or more in some cases. In this case, it is usually difficult to secure the necessary current in one semiconductor chip (IGBT), and as illustrated in FIG. 2, it is necessary to secure the necessary current by connecting a plurality of semiconductor chips (IGBT) in parallel. It should be noted that each of the semiconductor chips CHP1, CHP2, and CHP3 and each of the freewheeling diodes DDl1, DDl2, and DDl3 in FIG. 2 is mounted in a variety of forms. For example, as for one semiconductor chip and one freewheeling diode which are configured as one package component, three package components may be combined to be used, or such three package components combined in advance as one module component may be used, or the like.

<<Problems of Power Conversion Device>>

Figure 11A:
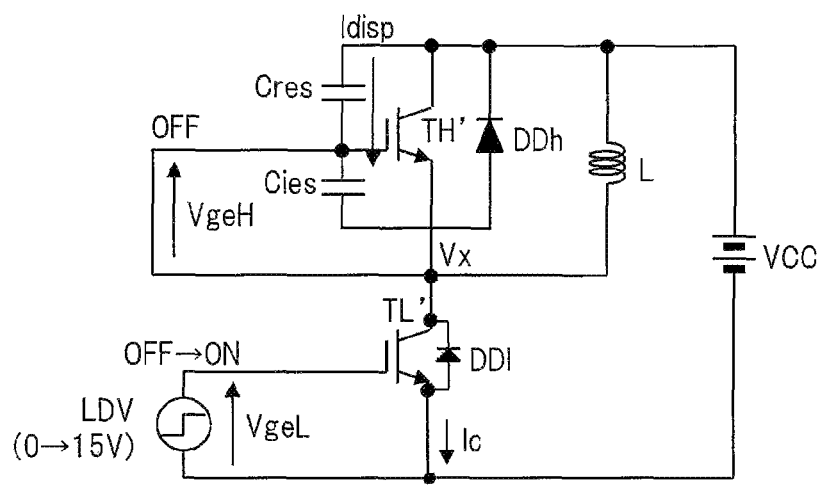
FIGS. 11A and 11B are explanatory diagrams illustrating an example of a mechanism of erroneous turn-on in a half-bridge circuit.
Figure 11B:
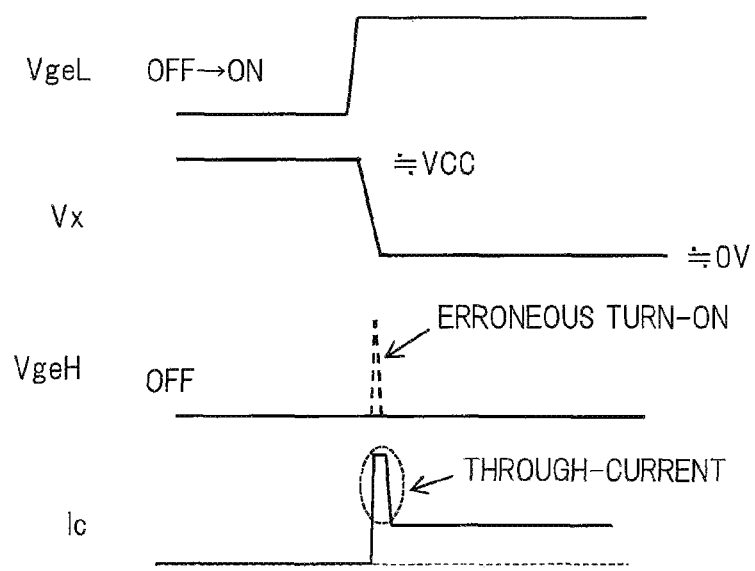

FIGS. 11A and 11B are explanatory diagrams illustrating an example of a mechanism of erroneous turn-on in a half-bridge circuit. FIG. 11A illustrates a configuration example of the half-bridge circuit of one phase with respect to the half-bridge circuit of three phases constituting the inverter unit IVU of FIG. 1, for example. In FIG. 11A, the inductor L connected between the emitter and the collector of the high-side transistor TH' is assumed to be the load LD in FIG. 1. In addition, in practice, a parasitic capacitance called a feedback capacitance Cres is present between the gate and collector of the high-side transistor TH' (and the low-side transistor TL'), and a parasitic capacitance called an input capacitance Cies is present between the gate and the emitter.

In FIG. 11A, first, it is assumed that the current based on the electromotive force caused by the inductor L flows back through the freewheeling diode DDh of the high-side transistor TH', in a state where the high-side transistor TH' and the low-side transistor TL' are both turned off. In this case, the voltage Vx of the emitter of the high-side transistor TH' (the collector of the low-side transistor TL') almost reaches the level of the power supply voltage VCC. Next, it is assumed that the low-side driver LDV applies a predetermined ON voltage (for example, +15 V) to the gate-emitter voltage VgeL of the low-side transistor TL' from this state.

As a result, the freewheeling diode DDh reversely recovers, and as illustrated in FIG. 11B, the voltage Vx falls from the level in the vicinity of the power supply voltage VCC to the level in the vicinity of 0 V (the ON-voltage VCE(sat) of the low-side transistor TL' in detail). With the voltage change rate (dV/dt) in the voltage Vx, as illustrated in FIG. 11A, the displacement current Idisp in equation (1) flows through the feedback capacitance Cres and the input capacitance Cies of the high-side transistor TH'.

$$I\text{disp} = C\text{res} \times (dV/dt) \quad (1)$$

This displacement current Idisp causes the gate-emitter voltage VgeH of the high-side transistor TH' to instantaneously rise, as illustrated in FIG. 11B. The gate-emitter voltage VgeH is expressed in equation (2), and equation (3) is expressed by substituting equation (1) into equation (2).

$$Vge = \int (I\text{disp}/C\text{ies}) dt \quad (2)$$

$$Vge = \int (C\text{res}/C\text{ies}) dV \quad (3)$$

Then, when the gate-emitter voltage VgeH exceeds a threshold voltage of the high-side transistor TH', an instantaneous through-current flows, as illustrated in FIG. 11B. Such a phenomenon is called as an erroneous turn-on. When the erroneous turn-on occurs, the switching loss increases, and the power conversion efficiency (for example, power generation efficiency in the example illustrated in FIG. 1) is reduced. It should be noted that although the erroneous turn-on that may occur in the high-side transistor when the low-side transistor is turned on is described here, the erroneous turn-on may occur in the low-side transistor also when the high-side transistor is turned on in the same manner.

Here, the IGBT typically has a plurality of withstand voltage specifications (that is, the maximum value specification of the emitter-collector voltage VCE). Typically, 600 V withstand voltage, 1200 V withstand voltage, and withstand voltages exceeding them (such as 1400 V withstand voltage and 1700 V withstand voltage) are exemplified. For example, in the system for high-power usage as illustrated in FIG. 1, the withstand voltage of at least 1200 V or more is required due to the high supply voltage VCC (for example, 1000 V or the like), and in view of the surge or the like, the withstand voltage of 1700 V or more is required. Usually, the feedback capacitance Cres is increased as the IGBT has a higher withstand voltage specification. Furthermore, as illustrated in FIG. 2, when a plurality of IGBTs are connected in parallel, the feedback capacitance Cres is increased by several times. Then, as can be understood from equation (3), the erroneous turn-on is more likely to occur.

Figure 14:
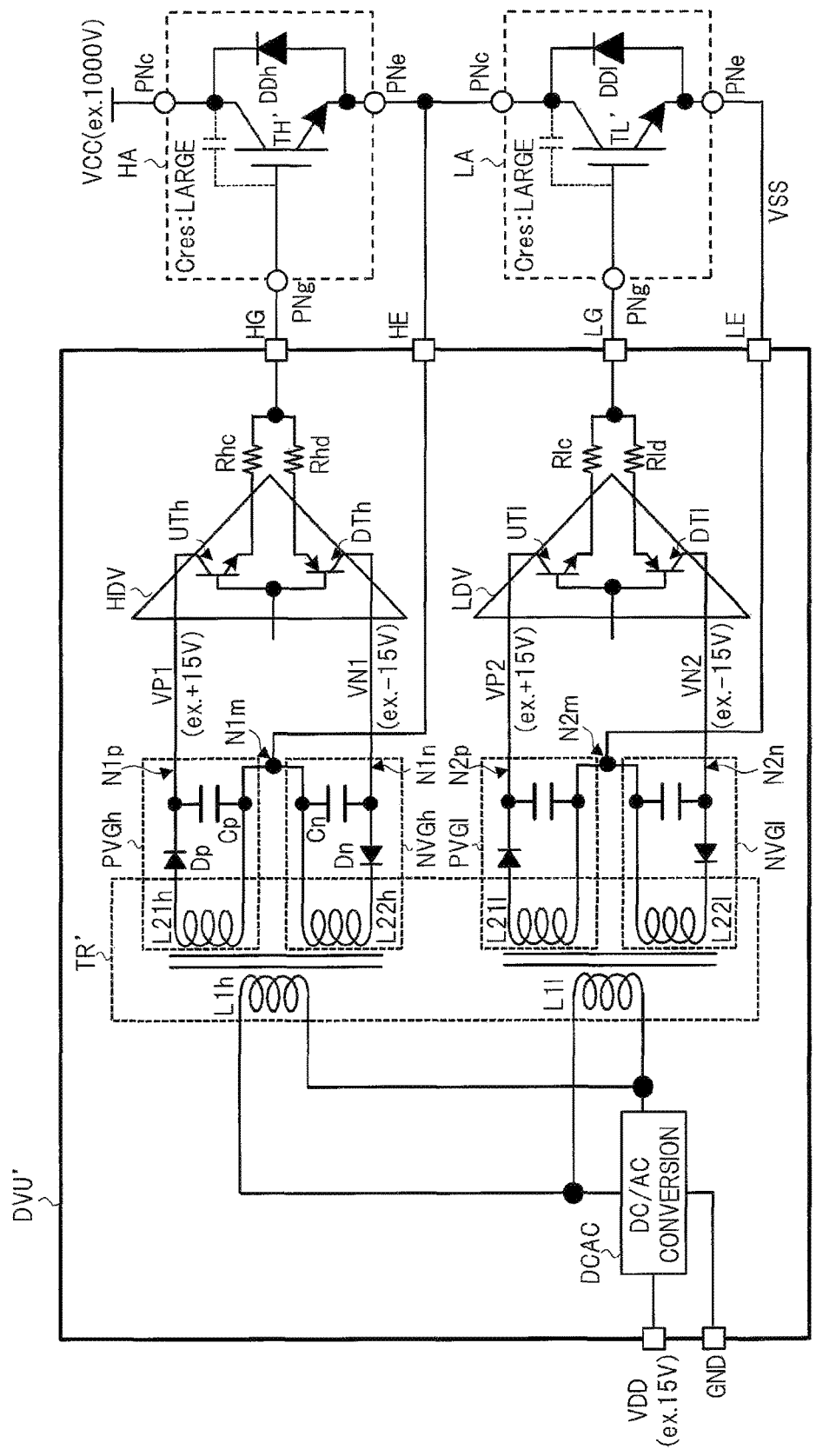
FIG. 14 is a circuit diagram illustrating a schematic configuration example of a main portion of the drive unit in the power conversion device studied as a comparative example of the present invention.

Therefore, in order to prevent such an erroneous turn-on, the method of applying a negative voltage (for example, −15 V or the like) to between the gate and the emitter when the IGBT is turned off is usually used. FIG. 14 is a circuit diagram illustrating a schematic configuration example of a main portion of the drive unit in the power conversion device studied as a comparative example of the present invention.

The drive unit DVU' illustrated in FIG. 14 corresponds, for example, to each of the drive units DVUu, DVUv, and DVUw illustrated in FIG. 1. The drive unit DVU' is constituted, for example, by the mounting of the various components on the wiring board. The drive unit DVU' includes an external terminal for the power supply voltage VDD (VDD), an external terminal for the ground power supply voltage GND (GND), a gate drive terminal HG and an emitter drive terminal HE for the high-side, and a gate drive terminal LG and an emitter drive terminal LE for the low-side.

The power supply voltage VDD, such as 15 V, is supplied to the external terminal (VDD). The gate drive terminal HG and the emitter drive terminal HE are respectively coupled to the gate terminal PNg and the emitter terminal PNe of the high-side transistor TH'. The gate drive terminal LG and the emitter drive terminal LE are respectively coupled to the gate terminal PNg and the emitter terminal PNe of the low-side transistor TL'.

In addition, the drive unit DVU' includes a DC/AC conversion circuit DCAC, a transformer TR', positive voltage generation circuits PVGh and PVGl, negative voltage generation circuits NVGh and NVGl, a high-side driver HDV and a low-side driver LDV, and various gate resistors Rhc, Rhd, Rlc, and Rld. The DC/AC conversion circuit DCAC generates an AC voltage from the power supply voltage VDD (such as 15 V), which is supplied from the external terminal (VDD).

The transformer TR' includes a primary coil L1$h$ and secondary coils L21$h$ and L22$h$ for the high side, and a primary coil L1$l$ and secondary coils L21$l$ and L22$l$ for the low side. One end of each of the secondary coils L21$h$ and L22$h$ for the high side is coupled in common to a midpoint node N1$m$, and the midpoint node N1$m$ is coupled to the emitter drive terminal HE. In the high side, an AC voltage generated by the DC/AC conversion circuit DCAC is applied to the primary coil L1$h$. In response to this application, the secondary coil L21$h$ generates an AC voltage according to a ratio of the numbers of turns of the primary coil L1$h$ and the secondary coil L21$h$, and the secondary coil L22$h$ also generates an AC voltage according to a ratio of the numbers of turns of the primary coil L1$h$ and the secondary coil L22$h$.

The positive voltage generation circuit PVGh is a circuit for generating a positive voltage for the high-side driver HDV, and partly includes the secondary coil L21$h$ of the transformer TR' described above, and further includes a half-wave rectifier circuit including a diode Dp and a capacitor Cp. The half-wave rectifier circuit performs a half-wave rectification on the positive voltage side of the AC voltage, which is generated by the secondary coil L21$h$, with the diode Dp, and generates a positive voltage VP1 (such as +15 V) in the node Nip (the other end of the capacitor Cp), based on the node N1$m$ (one end of the capacitor Cp).

The negative voltage generation circuit NVGh is a circuit for generating a negative voltage for the high-side driver HDV, and partly includes the secondary coil L22$h$ of the transformer TR' described above, and further includes a half-wave rectifier circuit including a diode Dn and a capacitor Cn. The half-wave rectifier circuit performs a half-wave rectification on the negative voltage side of the AC voltage, which is generated by the secondary coil L22$h$, with the diode Dn, and generates a negative voltage VN1 (such as −15 V) in the node N1$n$ (the other end of the capacitor Cn), based on the node N1$m$ (one end of the capacitor Cn).

As in the case of the high side, one end of each of the secondary coils L21$l$ and L22$l$ for the low side is coupled in common to a midpoint node N2$m$, and the midpoint node N2$m$ is coupled to the emitter drive terminal LE. In the low side, an AC voltage generated by the DC/AC conversion circuit DCAC is applied to the primary coil L1$l$. In response to this application, the secondary coil L21$l$ generates an AC voltage according to a ratio of the numbers of turns of the primary coil L1$l$ and the secondary coil L21$l$, and the secondary coil L22$l$ also generates an AC voltage according to a ratio of the numbers of turns of the primary coil L1$l$ and the secondary coil L22$l$.

The positive voltage generation circuit PVGl is a circuit for generating a positive voltage for the low-side driver LDV, and partly includes the secondary coil L21$l$ of the transformer TR' described above, and further includes a half-wave rectifier circuit as in the case of the positive voltage generation circuit PVGh. The half-wave rectifier circuit generates a positive voltage VP2 (such as +15 V) in the node N2$p$, based on the node N2$m$. The negative voltage generation circuit NVGl is a circuit for generating a negative voltage for the low-side driver LDV, and partly includes the secondary coil L22$l$ of the transformer TR' described above, and further includes a half-wave rectifier circuit as in the case of the negative voltage generation circuit NVGh. The half-wave rectifier circuit generates a negative voltage VN2 (such as −15 V) in the node N2$n$, based on the node N2$m$.

The high-side driver HDV includes a pull-up transistor UTh and a pull-down transistor DTh, and drives the high-side transistor TH' through the gate drive terminal HG and the emitter drive terminal HE. In this example, the high-side driver HDV is set as a totem-pole circuit that uses bipolar transistors constituting emitter followers for the pull-up transistor UTh and the pull-down transistor DTh. This circuit can supply a sufficient current to the gate drive terminal HG, and can rapidly charge and discharge the gate capacitance of the high-side transistor TH'.

The pull-up transistor UTh applies the positive voltage VP1 previously described to the gate drive terminal HG through the resistor Rhc, based on the emitter drive terminal HE (node N1$m$), when the high-side transistor TH' is driven to be turned on. The resistor Rhc is provided so as to adjust a turn-on time of the high-side transistor TH'. The pull-down transistor DTh applies the negative voltage VN1 previously described to the gate drive terminal HG through the resistor Rhd, based on the emitter drive terminal HE (node N1$m$), when the high-side transistor TH' is driven to be turned off. The resistor Rhd is provided so as to adjust a turn-off time of the high-side transistor TH'.

As in the case of the high-side driver HDV, the low-side driver LDV is set as a totem-pole circuit including a pull-up transistor UTl and a pull-down transistor DTl, and drives the low-side transistor TL' through the gate drive terminal LG and the emitter drive terminal LE. The pull-up transistor UTl applies the positive voltage VP2 previously described to the gate drive terminal LG through the resistor Rlc, based on the emitter drive terminal LE (node N2$m$), when the low-side transistor TL' is driven to be turned on. The pull-down transistor DTl applies the negative voltage VN2 previously described to the gate drive terminal LG through the resistor Rld, based on the emitter drive terminal LE, when the low-side transistor TL' is driven to be turned off.

Thus, the negative voltage generation circuits NVGh and NVGl are provided in the drive unit DVU' illustrated in FIG. 14, thereby preventing the erroneous turn-on described in FIGS. 11A and 11B. However, in this case, with the mounting of the negative voltage generation circuits NVGh and NVGl, the number of mounted components in the drive unit DVU' (wiring board) (three wiring boards in the example of FIG. 1) increases. The increase in the number of mounted components may cause the increase in cost such as the increase in the component cost, or the increase in the mounting cost to occur. Furthermore, the size of the wiring board also increases, and the increase in the cost associated with this may occur.

It should be noted that, for example, in the low to medium power usages such as the case of using a HVIC (High Voltage IC), there is a case where the erroneous turn-on can be prevented without providing such a negative voltage generation circuit. However, in a high power usage that requires a withstand voltage of 1200 V or more (preferably 1400 V or more) and passes a current of 100 A or more (preferably several hundred A or more), there is usually a need for a negative voltage generation circuit. In this case, the negative voltage generation circuit is desirable to be configured by using a transformer and the like on the wiring board, as illustrated in FIG. 14, so as to perform sufficient power supply in an insulated state.

<<Configuration of Drive Unit (Drive Device)>>

Figure 3:
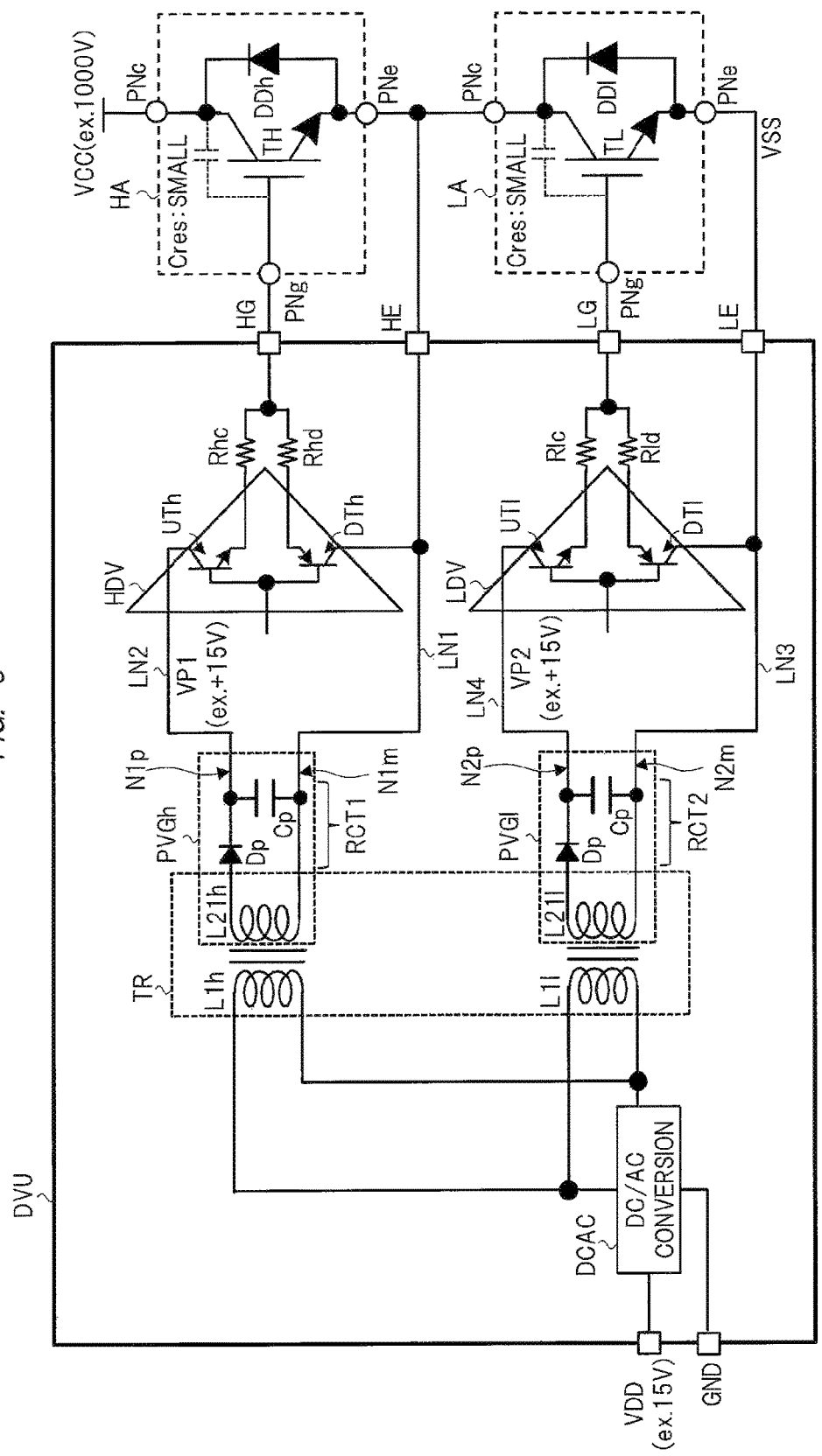
FIG. 3 is a circuit diagram illustrating a schematic configuration example of a main portion of the drive unit (drive device) in the power conversion device in FIG. 1.

FIG. 3 is a circuit diagram illustrating a schematic configuration example of a main portion of the drive unit (drive device) in the power conversion device in FIG. 1. The drive unit (drive device) DVU illustrated in FIG. 3 corresponds to each of the drive units DVUu, DVUv, and DVUw illustrated in FIG. 1, and has a configuration that does not include the negative voltage generation circuits NVGh and NVGl in FIG. 14, as compared with the drive unit DVU' in FIG. 14.

Specifically, unlike the case in FIG. 14, the transformer TR includes one secondary coil L21$h$ corresponding to the primary coil L1$h$, and includes one secondary coil L21$l$ corresponding to the primary coil L1$l$. The AC voltage from the DC/AC conversion circuit (AC voltage generation circuit) DCAC is applied to the primary coils L1$h$ and L1$l$, as in the case of FIG. 14.

The positive voltage generation circuit PVGh for the high-side includes a secondary coil L21$h$ of the transformer TR, and further includes a rectifier circuit (for example, half-wave rectifier circuit) including a diode Dp and a capacitor Cp RCT1. The rectifier circuit RCT1 generates a positive voltage VP1 in the node Nip based on the node N1$m$, as described in FIG. 14.

The node Nip is coupled to one end (collector) of the pull-up transistor (here, npn-type bipolar transistor) UTh of the high-side driver HDV through the wiring LN2 on the wiring board, as in the case of FIG. 14. On the other hand, the node N1$m$ is coupled to the emitter drive terminal HE through the wiring LN1 on the wiring board, and is further coupled to one end (collector) of the pull-down transistor (here, pnp-type bipolar transistor) DTh of the high-side driver HDV, unlike the case in FIG. 14.

Similarly, the positive voltage generation circuit PVGl for the low-side includes a secondary coil L21$l$ of the transformer TR, and further includes a rectifier circuit (for example, half-wave rectifier circuit) RCT2 including a diode Dp and a capacitor Cp. The rectifier circuit RCT2 generates a positive voltage VP2 in the node N2$p$ based on the node N2$m$, as described in FIG. 14.

The node N2$p$ is coupled to one end (collector) of the pull-up transistor (in this case, npn-type bipolar transistor) UTl of the low-side driver LDV through the wiring LN4 on the wiring board, as in the case in FIG. 14. On the other hand, the node N2$m$ is coupled to the emitter drive terminal LE through the wiring LN3 on the wiring board, and is further coupled to one end (collector) of the pull-down transistor (here, pnp-type bipolar transistor) DTl of the low-side driver LDV, unlike the case in FIG. 14.

As a result, the pull-down transistor DTh of the high-side driver HDV couples the gate drive terminal HG to the emitter drive terminal HE when the high-side transistor TH is driven to be turned off. In other words, the high-side driver HDV applies the gate-emitter voltage VgeH of about 0 V to the high-side transistor TH when the high-side transistor TH is driven to be turned off. Similarly, the pull-down transistor DTl of the low-side driver LDV couples the gate drive terminal LG to the emitter drive terminal LE when the low-side transistor TL is driven to be turned off. In other words, the low-side driver LDV applies the gate-emitter voltage VgeL of about 0 V to the low-side transistor TL when the low-side transistor TL is driven to be turned off.

Thus, the drive unit (drive device) DVU does not include the negative voltage generation circuits, whereby the number of the mounted components in the drive unit DVU (wiring board) (in the example in FIG. 1, three wiring boards) can be reduced. Specifically, the reduction in the number of turns in the transformer TR, and the reduction in the diode components and the capacitor components (the diodes Dn and the capacitors Cn in FIG. 14) can be achieved. As a result, various kinds of cost such as the component cost and the mounting cost can be reduced, and the size of the wiring board may be reduced.

It should be noted that although two primary coils L1$h$ and L1$l$ are provided here, when the total power required by the high-side driver HDV and the low-side driver LDV can be supplied by one primary coil, the primary coils L1$h$ and L1$l$ may be integrated as a single primary coil. In addition, although bipolar transistors constituting the emitter followers are used here, the high-side driver HDV and the low-side driver LDV are not necessarily limited to this configuration, and may be configured by using, for example, MOS transistors and the like. Furthermore, although the half-wave rectifier circuits are used as the rectifying circuits RCT1 and RCT2 here, full-wave rectifier circuits capable of achieving more stable voltages may be used by using the area obtained by the reduction in the negative voltage generation circuits.

Here, in order to prevent the erroneous turn-on as illustrated in FIGS. 11A and 11B without the use of the negative voltage generation circuits as illustrated in FIG. 3, for example, the IGBT having a small feedback capacitance Cres and capable of handling the high-power usages is used as the high-side transistor TH and the low-side transistor TL. Since the IGBT having a small feedback capacitance Cres is used, the gate-emitter voltage Vge rising instantaneously can be reduced as can be understood from equation (3), and as a result, the erroneous turn-on can be prevented.

<<Structure of High-Side/Low-Side Transistor>>

Figure 4:
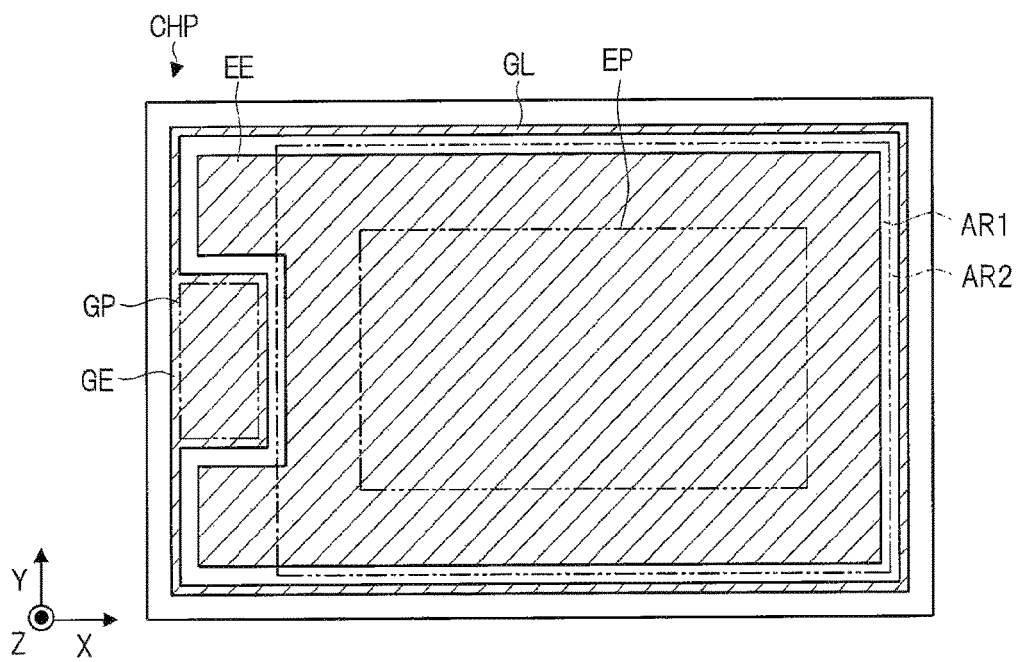
FIG. 4 is a plan view illustrating a structural example of a semiconductor chip configuring the high-side transistor or the low-side transistor in FIG. 2.

FIG. 4 is a plan view illustrating a structure example of a semiconductor chip constituting the high-side transistor or the low-side transistor in FIG. 2. The semiconductor chip CHP illustrated in FIG. 4 includes a cell-forming region AR1, and a gate-wire-lead region AR2. The gate-wire-lead region AR2 is provided in the outer peripheral portion of the semiconductor chip CHP, and the cell-forming region AR1 is provided on the inside thereof.

An emitter electrode EE is provided in the cell-forming region AR1. The central portion of the emitter electrode EE serves as the emitter pad EP for connecting a bonding wire or the like. Specifically, an opening is provided in the insulating film formed on the emitter electrode EE, and the portion exposed from the opening serves as the emitter pad EP. The emitter electrode EE is made of a metal film containing, for example, aluminum as the main component.

A gate electrode GE, and a gate wiring GL connected to the gate electrode GE are provided in the gate-wire-lead region AR2. The central portion of the gate electrode GE serves as a gate pad GP for connecting a bonding wire or the like, as in the case of the emitter pad EP. The gate wiring GL and the gate electrode GE are made of a metal film containing, for example, aluminum as the main component.

Figure 5:
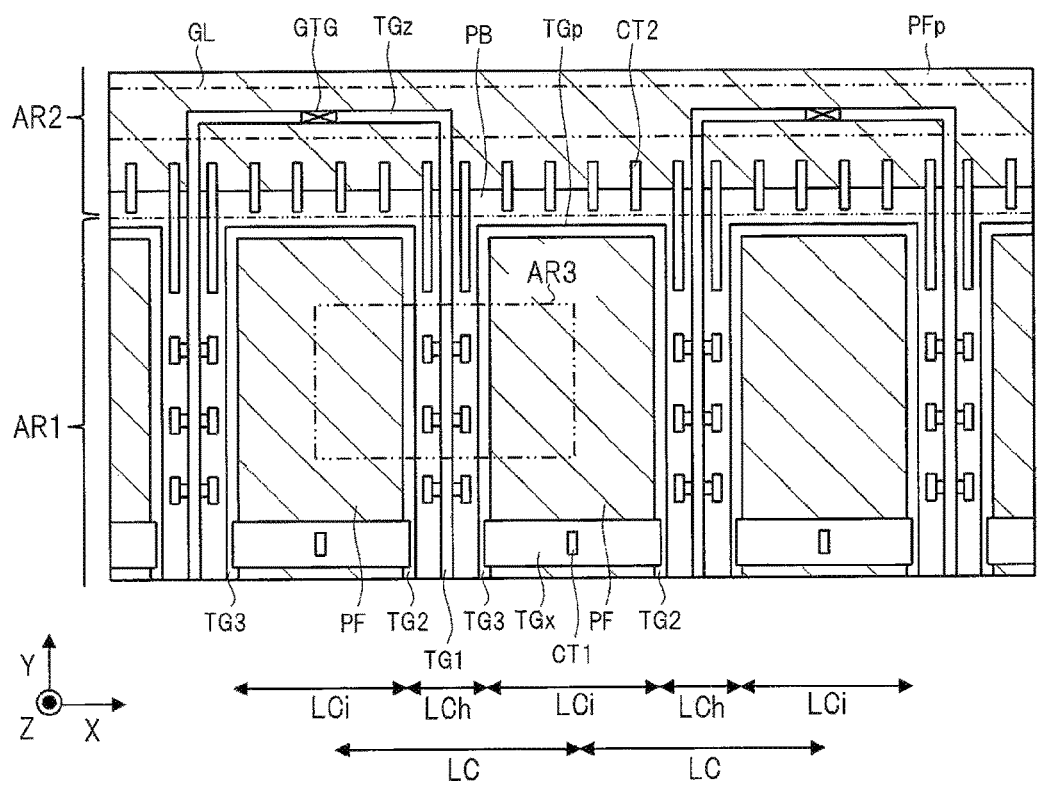
FIG. 5 is a plan view illustrating a structural example of a main portion of the cell-forming region and the gate-wire-lead region in FIG. 4.

FIG. 5 is a plan view illustrating a structural example of a main part of the cell-forming region and the gate-wire-lead region in FIG. 4. FIG. 5 illustrates a structural example of the portion arranged in the lower layer of the emitter electrode EE of FIG. 4 in the Z-axis, as an example of the boundary portion between the cell-forming region AR1 and the gate-wire-lead region AR2 in FIG. 4. First, a plurality of unit cell regions LC are arranged side by side in the X-axis direction in the cell-forming region AR1. Each of the unit cell regions LC includes a hybrid cell region LCh serving as an active cell region, and two inactive cell regions LCi arranged on both sides of the hybrid cell region LCh. Each of the hybrid cell region LCh and the two inactive cell regions LCi extends in the Y-axis direction.

Adjacent two unit cell regions LC in the X-axis direction share one inactive cell region LCi. That is, one of the two unit cell regions LC includes a half of the region of one inactive cell region LCi, and the other thereof includes the remaining half of the region thereof. The hybrid cell region LCh includes a trench gate electrode TG1 arranged at the center in the X-axis, and two trench gate electrodes TG2 and TG3 respectively arranged at intervals on both sides of the trench gate electrode TG1 in the X-axis. Each of the trench gate electrodes TG1, TG2, and TG3 extends in the Y-axis direction. In addition, in the X-axis, a p-type body region PB is arranged between the trench gate electrode TG1 and each of the trench gate electrodes TG2 and TG3.

On the other hand, in the X-axis, the region between the trench gate electrode TG2 and the trench gate electrode TG3 serves as an inactive cell region LCi. The inactive cell region LCi includes a p-type floating region PF. In addition, the inactive cell region LCi includes an emitter connection portion TGx formed in the same layer as the trench gate electrodes TG2 and TG3. The trench gate electrodes TG2 and TG3 are connected to each other through the emitter connection portion TGx, and the emitter connection portion TGx is electrically connected to the emitter electrode EE arranged in the upper layer in the Z-axis direction through a contact layer CT1. As a result, the trench gate electrodes TG2 and TG3 are electrically connected to the emitter electrode EE.

It should be noted that the trench gate electrodes TG2 and TG3 are connected to each other through the end portion trench gate electrode TGp in the boundary portion between the cell-forming region AR1 and the gate-wire-lead region AR2. As a result, the p-type floating region PF partitioned by the trench gate electrodes TG2 and TG3, the emitter connection portion TGx, and the end portion trench gate electrode TGp serves as a floating node.

In the gate-wire-lead region AR2, for example, a p-type region PFp is provided in such a manner as to surround the cell-forming region AR1. The p-type region PFp is electrically connected to the emitter electrode EE in the upper layer through a contact layer CT2. In addition, the contact layer CT2 electrically connects the p-type body region PB and the emitter electrode EE. Furthermore, the gate wiring GL, and the trench gate electrode TGz arranged in the lower layer of the gate wiring GL and formed in the same layer as the trench gate electrode TG1 in the cell-forming region AR1 are arranged in the gate-wire-lead region AR2.

The trench gate electrode TG1 extends toward the gate wiring GL, and is connected to the trench gate electrode TGz. The trench gate electrode TGz is electrically connected to the gate wiring GL through the connection electrode GTG. As a result, the trench gate electrode TG1 is electrically connected to the gate electrode GE through the gate wiring GL.

Figure 6:
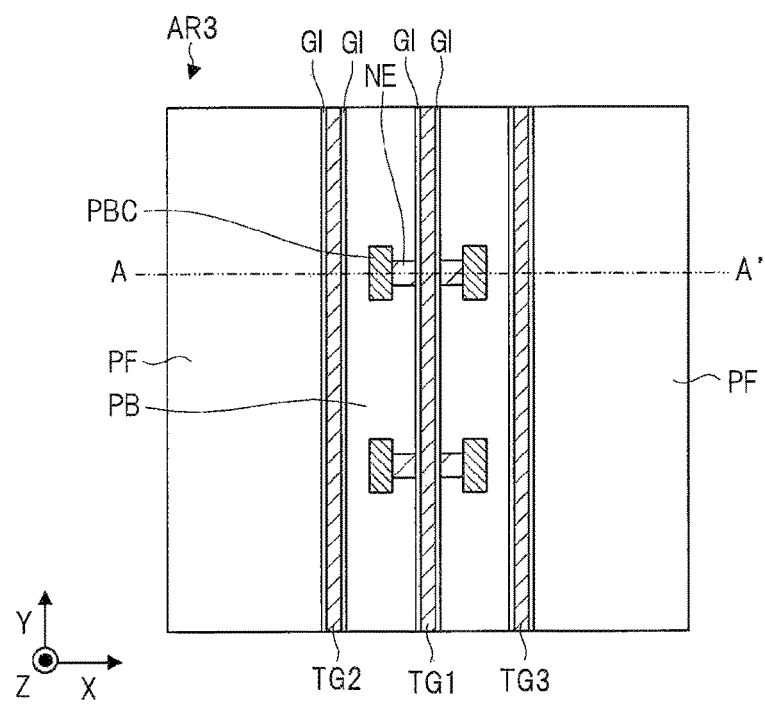
FIG. 6 is a plan view illustrating a detailed structural example of the hybrid cell region in FIG. 5.

FIG. 6 is a plan view illustrating a detailed structural example of the hybrid cell region in FIG. 5. FIG. 6 illustrates a structural example of the region AR3 in FIG. 5. As described above, the hybrid cell region (active cell region) LCh includes a trench gate electrode TG1 electrically connected to the gate electrode GE, and trench gate electrodes TG2 and TG3 arranged at intervals on both sides of the trench gate electrode TG1 and electrically connected to the emitter electrode EE. Thus, in the active cell region, the structure where three trench gate electrodes TG2, TG1, and TG3 arranged in this order in the X-axis direction respectively serve as the emitter electrode, the gate electrode, and the emitter electrode is referred to as the EGE structure in the present specification.

Specifically, the trench gate electrodes TG1, TG2, and TG3 are arranged so as to be embedded in the respective three trenches serving as the grooves. A gate insulating film GI is formed on the inner wall of each of the trenches, and each of the trench gate electrodes TG1, TG2, and TG3 is embedded so as to be in contact with the gate insulating film GI.

In addition, a p-type body region PB is arranged between the trench gate electrode TG1 and each of the trench gate electrodes TG2 and TG3. The p-type body region PB is continuously formed along the Y-axis direction. On the other hand, a p-type floating region PF serving as the floating node is arranged on the side opposite to the p-type body region PB across the trench gate electrode TG2. Similarly, a p-type floating region PF serving as the floating node is arranged on the side opposite to the p-type body region PB across the trench gate electrode TG3. Both the p-type body region PB and the p-type floating region PF are semiconductor regions serving as the p-type conduction type.

A plurality of $n^+$-type emitter regions NE and $p^+$-type body contact regions PBC are formed in the p-type body region PB. The plurality of $n^+$-type emitter regions NE are arranged spaced apart from each other along the Y-axis direction. The $n^+$-type emitter region NE is a semiconductor region serving as the n-type conduction type, different from the p-type, and the $n^+$ type has a higher impurity concentration than the n type. In addition, the $p^+$ type is a p-type conduction type, and has a higher impurity concentration than the p-type. In the X-axis, the $n^+$-type emitter regions NE are arranged on both sides of the trench gate electrode TG1. The $p^+$-type body contact region PBC is arranged in such a manner as to interpose the $n^+$-type emitter region NE between the trench gate electrode TG1 and the $p^+$-type body contact region PBC.

Figure 7:
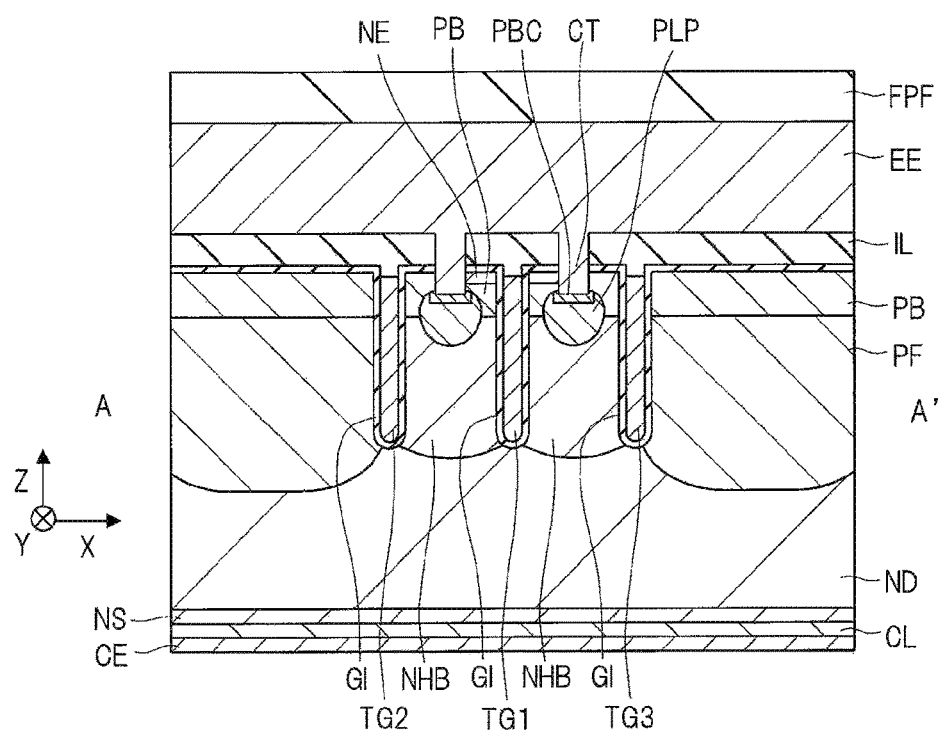
FIG. 7 is a cross-sectional view illustrating a structural example taken from line A-A' of FIG. 6.

FIG. 7 is a cross-sectional view illustrating a structural example taken from line A-A' in FIG. 6. In the hybrid cell region (active cell region) LCh illustrated in FIG. 7, as described in FIG. 6, the three trench gate electrodes TG2, TG1, and TG3 arranged in this order are formed on the main surface side of the semiconductor substrate, and a p-type body region PB is formed between the trench gate electrode TG1 and each of the trench gate electrodes TG2 and TG3.

Each of the trench gate electrodes TG1, TG2, and TG3 is embedded so as to be in contact with the gate insulating film GI formed on the inner wall of each of the trenches. The trench gate electrodes TG1, TG2, and TG3 are, for example, formed of polysilicon or the like. In the p-type body region PB, $n^+$-type emitter regions NE are formed on both sides of the trench gate electrode TG1, and the $p^+$-type body contact region PBC is formed in such a manner as to interpose the $n^+$-type emitter region NE between the trench gate electrode TG1 and the $p^+$-type body contact region PBC.

In addition, the emitter electrode EE is formed in the upper layer of these regions through an interlayer insulating film IL, and the insulating film FPF is further formed in the upper layer of the emitter electrode EE. The p+-type body contact region PBC is electrically connected to the emitter electrode EE through the contact layer CT formed in the interlayer insulating film IL. Here, the p+-type body contact region PBC is formed in the layer lower than the n+-type emitter region NE, and the contact layer CT is in contact with both the n+-type emitter region NE and the p-type body region PB. As a result, the n+-type emitter region NE and the p-type body region PB are electrically connected to the emitter electrode EE through the contact layer CT.

In the region between the trench gate electrode TG1 and each of the trench gate electrodes TG2 and TG3, a n-type hole barrier region NHB for increasing the IE effect is formed in the lower layer of the p-type body region PB. In the lower layer of the p+-type body contact region PBC, a p+-type latch-up prevention region PLP having lower impurity concentration than the p+-type body contact region PBC and being arranged so as to be in contact with the n-type hole barrier region NHB is formed.

A n−-type drift region ND is formed in the lower layer of the n-type hole barrier region NHB. The n− type is a n-type conduction type, and has the lower impurity concentration than the n− type. A n-type field stop region NS for stopping the spread of the electric field is formed in the lower layer of the n−-type drift region ND, and a p+-type collector region CL is further formed in the lower layer of the n-type field stop region NS. The collector electrode CE electrically connected to the p+-type collector region CL is formed in the lower layer of the p+-type collector region CL. It should be noted that a p-type floating region PF serving as the floating node is formed on each of the side opposite to the n-type hole barrier region NHB across the trench gate electrode TG2 and the side opposite to the n-type hole barrier region NHB across the trench gate electrode TG3.

When a predetermined gate voltage is applied to the trench gate electrode TG1, a channel is formed in the p-type body region PB, and electrons from the n+-type emitter region NE are injected into the n−-type drift region ND through the n-type hole barrier region NHB. In response to this injection, holes are injected from the p+-type collector region CL into the n−-type drift region ND. The holes are stored in the n−-type drift region ND due to the n-type hole barrier region NHB and the p-type floating region PF both serving as the barrier. Accordingly, the reduction in the on-resistance of the n−-type drift region ND can be achieved by the high IE effect. As a result, both a sufficient withstand voltage and low conduction loss can be achieved, even in the high power usage as illustrated in FIG. 1, for example.

<<Parasitic Capacitance of High-Side/Low-Side Transistor>>

Figure 8A:
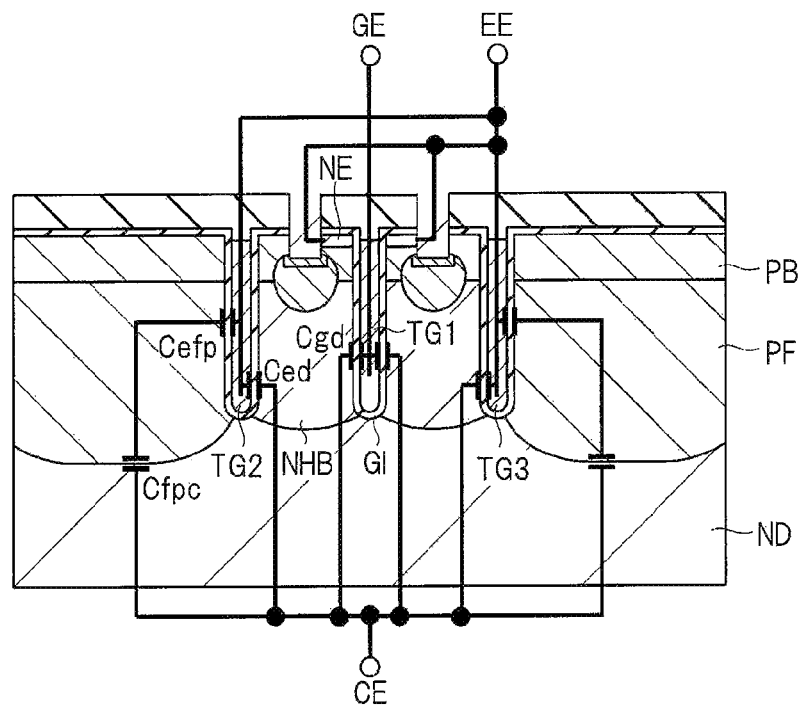
FIG. 8A is an explanatory diagram illustrating a parasitic capacitance present in the structure of FIG. 7.
Figure 8B:
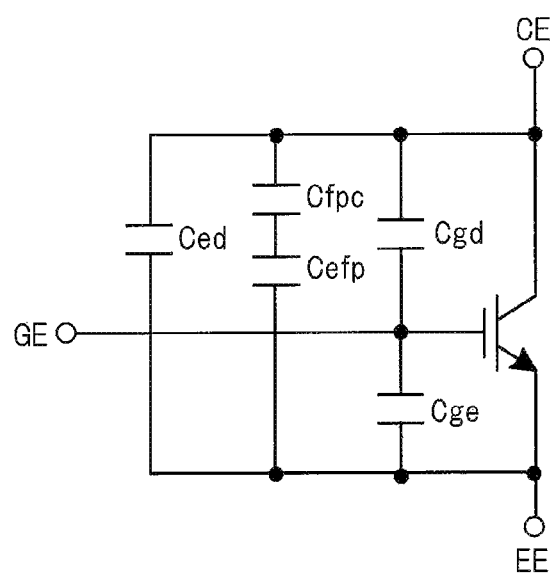
FIG. 8B is an equivalent circuit diagram of FIG. 8A.

FIG. 8A is an explanatory diagram illustrating a parasitic capacitance present in the structure of FIG. 7, and FIG. 8B is an equivalent circuit diagram of FIG. 8A. In the IGBT of the EGE structure illustrated in FIG. 7 and the like, various parasitic capacitances Cgd, Cge, Cfpc, Cefp, and Ced as illustrated in FIG. 8B are present. The parasitic capacitance Cgd is present between the gate (gate electrode GE) and the collector (collector electrode CE), and mainly corresponds to the capacitance of the gate insulating film GI between the trench gate electrode TG1 and the n-type hole barrier region NHB, as illustrated in FIG. 8A.

The parasitic capacitance Cge is present between the gate and the emitter (emitter electrode EE), and although omitted in FIG. 8A, the parasitic capacitance Cge is present between the trench gate electrode TG1 and the n+-type emitter region NE, and between the trench gate electrode TG1 and each of the trench gate electrodes TG2 and TG3, in an appropriate manner. The parasitic capacitance Ced is present between the emitter and the collector, and mainly corresponds to the capacitance of the gate insulating film GI between each of the trench gate electrodes TG2 and TG3 and the n-type hole barrier region NHB, as illustrated in FIG. 8A.

The parasitic capacitance Cfpc mainly corresponds to the junction capacitance between the n-type drift region ND and the p-type floating region PF, as illustrated in FIG. 8A. The parasitic capacitance Cefp mainly corresponds to the capacitance of the gate insulating film GI between the p-type floating region PF and each of the trench gate electrodes TG2 and TG3, as illustrated in FIG. 8A. As a result, the collector is coupled to the emitter through the parasitic capacitance Cfpc and the parasitic capacitance Cefp.

Structure of High-Side/Low-Side Transistor (Comparative Example)>>

Figure 12:
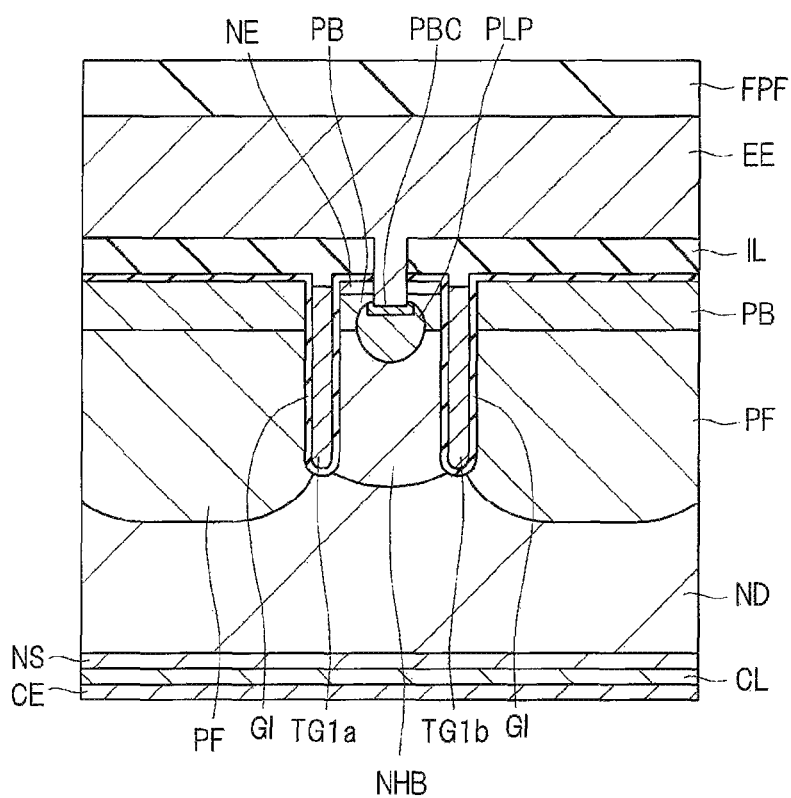
FIG. 12 is a cross-sectional view illustrating a structural example of the active region in the high-side transistor or the low-side transistor studied as a comparative example of the present invention.

FIG. 12 is a cross-sectional view illustrating a structural example of the active region in the high-side transistor or the low-side transistor studied as a comparative example of the present invention. In the active region illustrated in FIG. 12, unlike the case in FIG. 7, two trench gate electrodes TG1a and TG1b arranged in order are formed on the main surface side of the semiconductor substrate, and the p-type body region PB is formed between the trench gate electrode TG1a and the trench gate electrode TG1b.

In the p-type body region PB, a n+-type emitter region NE is formed adjacent to each of the trench gate electrodes TG1a and TG1b, and a p+-type body contact region PBC is formed between the two n+-type emitter regions NE. In addition, a p-type floating region PF is formed on the side opposite to the n-type hole barrier region NHB across each of the trench gate electrodes TG1a and TG1b. Here, each of the trench gate electrodes TG1a and TG1b is electrically connected to the gate electrode GE (not illustrated). In the present specification, the structure where the two trench gate electrodes TG1a and TG1b arranged in this order are connected to the gate electrode GE is referred to as the GG structure, as compared with the EGE structure in FIG. 7.

<<Parasitic Capacitance of High-Side/Low-Side Transistor (Comparison with Comparative Example)>>

Figure 13A:
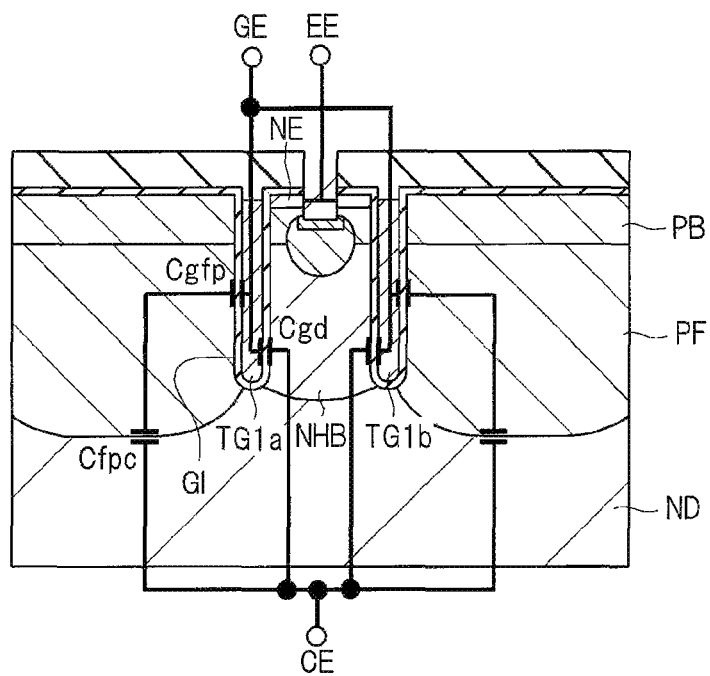
FIG. 13A is an explanatory diagram illustrating the parasitic capacitance present in the structure of FIG. 12.
Figure 13B:
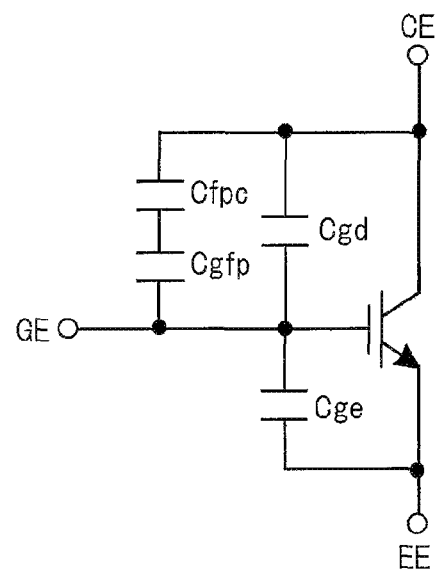
FIG. 13B is an equivalent circuit diagram of FIG. 13A.

FIG. 13A is an explanatory diagram illustrating a parasitic capacitance present in the structure of FIG. 12, and FIG. 13B is an equivalent circuit diagram of FIG. 13A. As illustrated in FIGS. 13A and 13B, the parasitic capacitances Cfpc and Cgfp associated with the p-type floating region PF are present in the GG structure, as in the parasitic capacitances Cfpc and Cefp in the EGE structure illustrated in FIGS. 8A and 8B.

However, there is a big difference in that the parasitic capacitances Cfpc and Cefp are present between the emitter and the collector in the EGE structure, whereas the parasitic capacitances Cfpc and Cgfp are present between the gate and the collector in the GG structure. That is, the gate is arranged close to the p-type floating region PF (in other words, inactive cell region LCi) in the GG structure, whereas the gate is interposed between the emitters in the EGE structure, and therefore the emitter is arranged close to the p-type floating region PF.

As a result, as compared with the GG structure, the feedback capacitance Cres between the gate and the collector can be greatly reduced in the EGE structure. Specifically, according to the study by the present inventors and the like, the value of (Cres/Cies) (that is, equation (3)) in the EGE structure is about 20% of the value in the GG structure. As a result, as illustrated in FIG. 3, the erroneous turn-on can be prevented even when the drive unit DVU not including the negative voltage generation circuit is used. In addition, the use of the EGE structure enables the switching speed to be increased and also the switching loss to be reduced, because the feedback capacitance Cres is small as compared with the feedback capacitance Cres in the GG structure.

As described above, typically, the number of the mounted components can be reduced by using the power conversion device and the drive device according to the first embodiment.

Second Embodiment

Configuration of Drive Unit (Drive Device) (Application Example)

Figure 9:
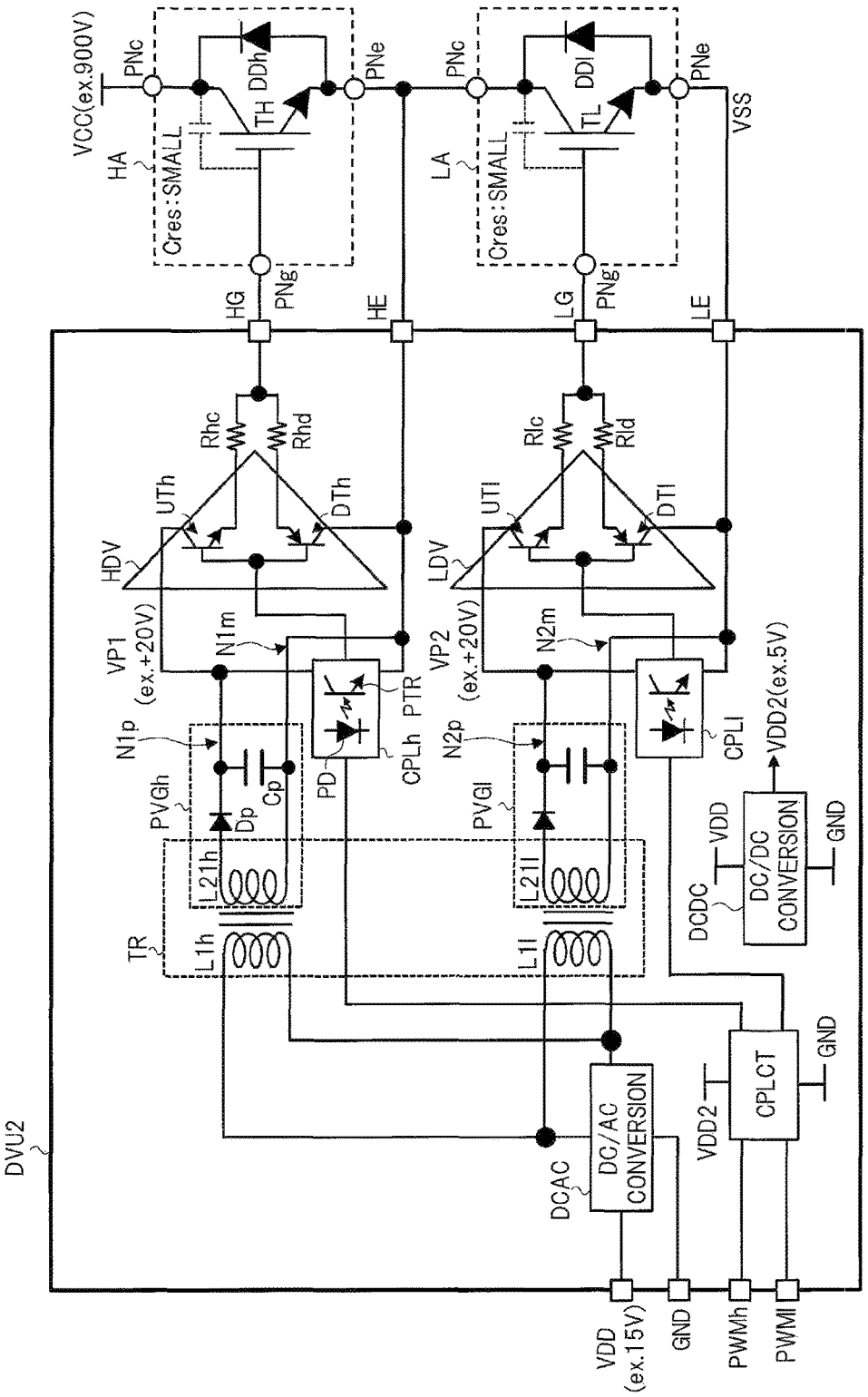
FIG. 9 is a circuit diagram illustrating a schematic configuration example of a main portion of the drive unit (drive device) in the power conversion device according to a second embodiment of the present invention.

FIG. 9 is a circuit diagram illustrating a schematic configuration example of a main portion of the drive unit (drive device) in the power conversion device according to a second embodiment of the present invention. The drive unit (drive device) DVU2 illustrated in FIG. 9 corresponds to each of the drive units DVUu, DVUv, and DVUw illustrated in FIG. 1. The drive unit DVU2 has a configuration where each of the external terminals for PWM (Pulse Width Modulation) signals PWMh and PWMl, a DC/DC conversion circuit DCDC, a coupler-control circuit CPLCT, and photocouplers CPLh and CPLl are added to the drive unit DVU illustrated in FIG. 3. The PWM signals PWMh and PWMl generated by the inverter control unit CTLU illustrated in FIG. 1 are input into the external terminals (PWMh and PWMl).

The DC/DC conversion circuit DCDC converts a power supply voltage VDD such as 15 V supplied from the external terminal (VDD) into a power supply voltage VDD2 such as 5 V. The coupler control circuit CPLCT is operated with the supply voltage VDD2, controls the photocoupler CPLh for the high side with the PWM signal PWMh input from the external terminal (PWMh), and controls the photocoupler CPLl for the low side with the PWM signal PWMl input from the external terminal (PWMl). As a result, the PWM signals PWMh and PWMl having voltage levels lower than the positive voltages VP1 and VP2 (for example, 5 V level) are respectively input into the photocouplers CPLh and CPLl.

The photocoupler CPLh converts the voltage level of the PWM signal PWMh into the voltage level according to the positive voltage VP1, and controls the high-side driver HDV with the converted PWM signal. Specifically, presence or absence of the light emission of the photodiode PD is controlled according to the logic level of the input PWM signal PWMh, the on-off of the phototransistor PTR is controlled according to the presence or absence of the light emission, and the PWM signal having a voltage level of the positive voltage VP1 is generated through a circuit (not illustrated) according to the on-off thereof. Then, the on-off of the pull-up transistor UTh and the pull-down transistor DTh in the high-side driver HDV is controlled by the PWM signal.

Similarly, the photocoupler CPLl converts the voltage level of the PWM signal PWMl into the voltage level according to the positive voltage VP2, and controls the low-side driver LDV with the converted PWM signal. Specifically, the on-off of the pull-up transistor UTl and the pull-down transistor DTl in the low-side driver LDV is controlled by the PWM signal having a voltage level of the positive voltage VP2 output from the photocoupler CPLl. Through the control using such a PWM signal, an AC voltage having a predetermined frequency and voltage is generated from the inverter unit IVU in FIG. 1, based on the period and the duty of the PWM signal In this configuration, the values of the positive voltages VP1 and VP2 are set to values greater than 15 V (such as 20 V) in FIG. 9, unlike the case in FIG. 3. As a result, as compared with the case in FIG. 3 (that is, the case where the values of the positive voltages VP1 and VP2 are set to 15 V), the on-resistance of the high-side transistor TH and the low-side transistor TL can be reduced, and therefore the reduction in the conduction loss can be achieved.

Here, in IGBT, the maximum value of the gate-emitter voltage is typically set to ±20 V, and in practice, the gate-emitter voltage of ±15 V is often used as illustrated in FIG. 14. In addition, the maximum output voltage of the photocouplers CPLh and CPLl is often about 30 V. In these circumstances, the configuration in FIG. 9 does not include the negative voltage generation circuit as described in the first embodiment, and therefore, unlike the case in FIG. 14, a margin of about 15 V can be obtained for the maximum output voltage of the photocouplers CPLh and CPLl. As a result, the value of the positive voltages VP1 and VP2 can be increased.

<<Board Layout of Drive Unit (Drive Device)>>

Figure 10A:
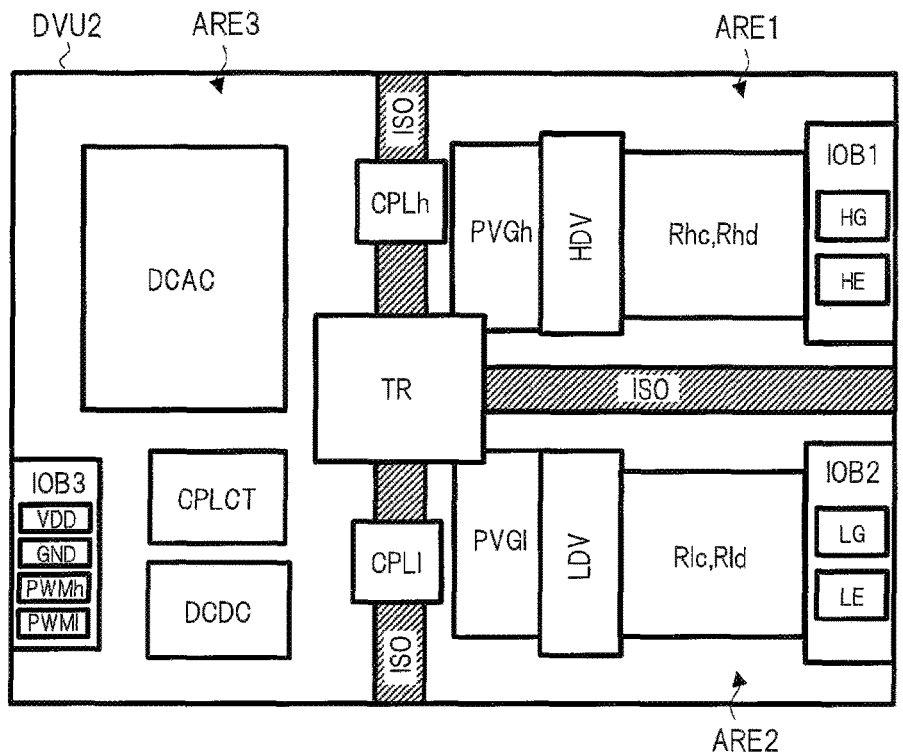
FIG. 10A is a plan view illustrating a schematic configuration example of a board layout in the drive unit of FIG. 9.
Figure 10B:
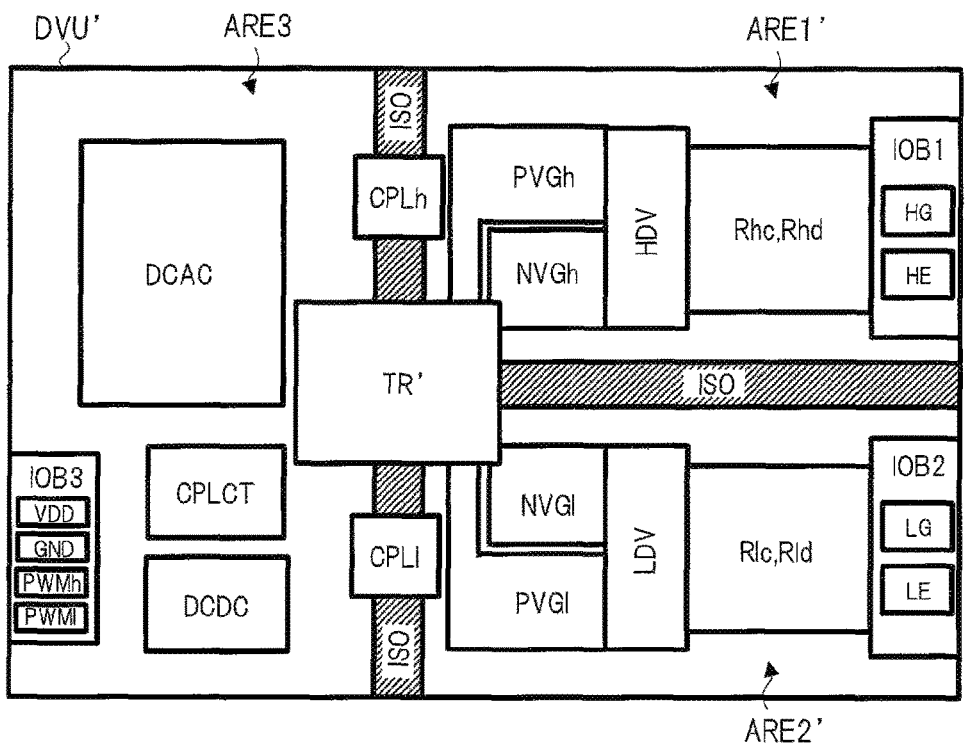
FIG. 10B is a plan view illustrating a schematic configuration example of a board layout as a comparative example of FIG. 10A.

FIG. 10A is a plan view illustrating a schematic configuration example of a board layout in the drive unit of FIG. 9, and FIG. 10B is a plan view illustrating a schematic configuration example of a board layout as a comparative example of FIG. 10A. As illustrated in FIG. 10A, the wiring board constituting the drive unit (drive device) DVU2 includes three wiring regions ARE1, ARE2, and ARE3 insulated from each other across the isolation region ISO. Each of the wiring regions ARE1, ARE2, and ARE3 has typically such a structure that a conductive film such as copper is formed on an insulator such as glass epoxy.

An external connector portion IOB3, the DC/AC conversion circuit DCAC, the coupler control circuit CPLCT, and the DC/DC conversion circuit DCDC are mounted on the wiring region ARE3. The external connector portion IOB3 includes four external terminals (VDD, GND, PWMh, and PWMl). An external connector portion IOB1, the positive voltage generation circuit PVGh, the high-side driver HDV, and the resistors Rhc and Rhd are mounted on the wiring region ARE1. The external connector portion IOB1 includes the gate drive terminal HG for the high side and the emitter drive terminal HE.

An external connector portion IOB2, the positive voltage generation circuit PVGl, the low-side driver LDV, and the resistors Rlc and Rld are mounted on the wiring region ARE2. The external connector portion IOB2 includes the gate drive terminal LG for the low side and the emitter drive terminal LE. The photocoupler CPLh is mounted between the wiring region ARE1 and the wiring region ARE3, and the photocoupler CPLl is mounted between the wiring region ARE2 and the wiring region ARE3. The transformer TR is mounted between the wiring region ARE3, and the wiring region ARE1 and wiring region ARE2.

Various circuits mounted on the wiring region ARE3 are operated based on the ground power supply voltage GND (0 V). On the other hand, various circuits mounted on the wiring region ARE1 are operated based on the voltage level of the emitter drive terminal HE. However, the voltage level of the emitter drive terminal HE changes between the vicinity of 0 V and the vicinity of the power supply voltage VCC (for example, 1000 V), unlike the ground power supply voltage GND. For this reason, the insulation region ISO is provided in FIG. 10A, and the power supply and the signal transmission are performed by using the transformer TR and the photocoupler CPLh.

In addition, the wiring region ARE2 is operated based on the ground power supply voltage VSS (0 V), and therefore can be integrated with the wiring region ARE3 in some cases. However, from the viewpoint that a large noise may occur in the ground power supply voltage VSS unlike the ground power supply voltage GND, and that the same method, as in the case of the wiring region ARE1, is used with respect to the power supply and the signal transmission from the wiring region ARE3 toward the wiring region ARE2, the wiring region ARE2 is separated from the wiring region ARE3 by the insulating region ISO in this case.

On the other hand, the board layout in the case where the photocouplers and the like in FIG. 9 are added to the configuration example in FIG. 14 is illustrated in FIG. 10B. In FIG. 10B, the negative voltage generation circuits NVGh and NVGl are respectively mounted on the wiring region ARE1' for the high-side and the wiring region ARE2' for the low side, and the size of the transformer TR' is large, as compared with the case in FIG. 10A. As a result, the number of the mounted components is increased, and accordingly, the increase in cost, the increase in the size of the wiring board, and the like may occur. Thus, it is beneficial to use the configuration example in FIG. 10A.

As described above, typically, the number of the mounted components can be reduced by using the power conversion device and the drive device according to the second embodiment, as in the case of the first embodiment. Furthermore, the drive voltage of the high-side/low-side transistor can be easily increased, and therefore the reduction in losses can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the above embodiments are those described in detail in order to better illustrate the invention and are not intended to be limited to necessarily provide all the configurations described. Part of the configuration of a certain embodiment can be replaced by the configuration of another embodiment, and the configuration of the other embodiment can be added to the configuration of the certain embodiment. Moreover, part of the configuration of the embodiment can be subjected to addition/deletion/replacement of other configurations.

What is claimed is:

1. A power conversion device comprising:
    a high-side transistor including an IGBT;
    a low-side transistor including an IGBT, and having a collector coupled to an emitter of the high-side transistor;
    a high-side driver configured to drive the high-side transistor;
    a low-side driver configured to drive the low-side transistor,
    wherein each of the high-side transistor and the low-side transistor includes:
        a first trench gate electrode arranged in an active cell region, and electrically connected to a gate; and
        a second trench gate electrode and a third trench gate electrode, each of which is arranged at intervals on both sides of the first trench gate electrode, and electrically connected to the emitter in the active cell region,
    wherein the high-side driver includes:
        a first pull-up transistor configured to apply a first voltage as a positive voltage to the gate, based on the emitter of the high-side transistor; and
        a first pull-down transistor configured to couple the gate of the high-side transistor to the emitter, and
    wherein the low-side driver includes:
        a second pull-up transistor configured to apply a second voltage as a positive voltage to the gate, based on the emitter of the low-side transistor; and
        a second pull-down transistor configured to couple the gate of the low-side transistor to the emitter; and
    a second rectifier circuit configured to rectify an AC voltage generated by a second secondary coil, and generate the second voltage in a second node based on a second reference node,
    wherein the second reference node is coupled to the emitter of the low-side transistor and one end of the second pull-down transistor, and
    the second node is coupled to one end of the second pull-up transistor.

2. The power conversion device according to claim 1, further comprising:
    a transformer including a primary coil, and a first secondary coil and the second secondary coil;
    an AC voltage generation circuit configured to generate an AC voltage, and apply the AC voltage to the primary coil; and
    a first rectifier circuit configured to rectify an AC voltage generated by the first secondary coil, and generate the first voltage in a first node based on a first reference node,
    the first node is coupled to one end of the first pull-up transistor, and
    the second reference node is coupled to the emitter of the low-side transistor and one end of the second pull-down transistor.

3. The power conversion device according to claim 2, further comprising:
    a first photocoupler configured to receive an input of a first PWM signal having a lower voltage level than the first voltage and the second voltage, convert the voltage level of the first PWM signal into a voltage level according to the first voltage, and control the high-side driver by using the converted PWM signal, and
    a second photocoupler configured to receive an input of a second PWM signal having a lower voltage level than the first voltage and the second voltage, convert the voltage level of the second PWM signal into a voltage level according to the second voltage, and control the low-side driver by using the converted PWM signal.

4. The power conversion device according to claim 2, wherein each of the high-side driver, the low-side driver, the transformer, the AC voltage generation circuit, the first rectifier circuit, and the second rectifier circuit is mounted on a wiring board.

5. The power conversion device according to claim 1, wherein each of the first voltage and the second voltage is greater than 15 V.

6. The power conversion device according to claim 1, wherein each of the high-side transistor and the low-side transistor has a withstand voltage of 1200 V or more.

7. The power conversion device according to claim 1, wherein each of the high-side transistor and the low-side transistor further includes:

a first semiconductor region arranged between the first trench gate electrode and the second trench gate electrode, and in which a channel is formed;
a second semiconductor region arranged between the first trench gate electrode and the third trench gate electrode, and in which a channel is formed;
a third semiconductor region arranged on a side opposite to the first semiconductor region across the second trench gate electrode, and configured to serve as a floating node; and
a fourth semiconductor region arranged on a side opposite to the second semiconductor region across the third trench gate electrode, and configured to serve as a floating node.

8. The power conversion device according to claim 1, wherein each of the high-side transistor and the low-side transistor includes a plurality of semiconductor chips having emitter electrodes, gate electrodes and collector electrodes,
the emitter electrodes of the plurality of semiconductor chips are coupled in common, and
the collector electrodes of the plurality of semiconductor chips are coupled in common.

9. The power conversion device according to claim 1, further comprising:
a plurality of the first pull-up transistors; and
a plurality of the second pull-up transistors,
each of the first pullup transistors of the high-side driver and the second pullup transistors of the low-side driver has an EGE-type structure of (emitter-gate-emitter type).

10. A power conversion device comprising:
a conversion unit configured to convert an AC voltage, which is externally input, into a DC voltage;
a capacitor configured to hold the DC voltage converted by the conversion unit;
an inverter unit configured to convert the DC voltage held in the capacitor into a three-phase AC voltage having a predetermined voltage and frequency; and
a drive unit configured to control the inverter unit,
wherein the inverter unit includes, with respect to each phase of the three phases,
a high-side transistor including an IGBT; and
a low-side transistor including an IGBT, and having a collector coupled to an emitter of the high-side transistor,
wherein the drive unit includes, with respect to each phase of the three phases,
a high-side driver configured to drive the high-side transistor; and
a low-side driver configured to drive the low-side transistor,
wherein each of the high-side transistor and the low-side transistor includes:
a first trench gate electrode arranged in an active cell region, and electrically connected to a gate; and
a second trench gate electrode and a third trench gate electrode, each of which is arranged at intervals on both sides of the first trench gate electrode, and electrically connected to the emitter in the active cell region,
wherein the high-side driver includes:
a first pull-up transistor configured to apply a first voltage as a positive voltage to the gate, based on the emitter of the high-side transistor, and
a first pull-down transistor configured to couple the gate of the high-side transistor to the emitter, and
wherein the low-side driver includes:
a second pull-up transistor configured to apply a second voltage as a positive voltage to the gate, based on the emitter of the low-side transistor; and
a second pull-down transistor configured to couple the gate of the low-side transistor to the emitter,
wherein the drive unit further includes, with respect to each phase of the three phases, a second rectifier circuit configured to rectify an AC voltage generated by a second secondary coil, and generate the second voltage in a second node based on a second reference node,
wherein the second reference node is coupled to the emitter of the low-side transistor and one end of the second pull-down transistor, and
the second node is coupled to one end of the second pull-up transistor.

11. The power conversion device according to claim 10, wherein the drive unit further includes, with respect to each phase of the three phases,
a transformer including a primary coil, and a first secondary coil and the second secondary coil;
an AC voltage generation circuit configured to generate an AC voltage, and apply the AC voltage to the primary coil; and
a first rectifier circuit configured to rectify an AC voltage generated by the first secondary coil, and generate the first voltage in a first node based on a first reference node,
the first node is coupled to one end of the first pull-up transistor, and
the second reference node is coupled to the emitter of the low-side transistor and one end of the second pull-down transistor.

12. The power conversion device according to claim 11, wherein each of the high-side driver, the low-side driver, the transformer, the AC voltage generation circuit, the first rectifier circuit, and the second rectifier circuit is mounted on a wiring board.

13. The power conversion device according to claim 10, wherein each of the high-side transistor and the low-side transistor further includes:
a first semiconductor region arranged between the first trench gate electrode and the second trench gate electrode, and in which a channel is formed;
a second semiconductor region arranged between the first trench gate electrode and the third trench gate electrode, and in which a channel is formed;
a third semiconductor region arranged on a side opposite to the first semiconductor region across the second trench gate electrode, and configured to serve as a floating node; and
a fourth semiconductor region arranged on a side opposite to the second semiconductor region across the third trench gate electrode, and configured to serve as a floating node.

14. The power conversion device according to claim 10, wherein the conversion unit receives an input of an AC voltage from a wind generator.

15. A drive device including a wiring board, the wiring board comprising:
a first drive terminal and a second drive terminal configured to drive a high-side transistor in a half-bridge circuit;
a third drive terminal and a fourth drive terminal configured to drive a low-side transistor in the half-bridge circuit;
a high-side driver including:

a first pull-up transistor configured to apply a first voltage as a positive voltage to the first drive terminal, based on the second drive terminal; and a first pull-down transistor configured to couple the first drive terminal to the second drive terminal;

a low-side driver including:

a second pull-up transistor configured to apply a second voltage as a positive voltage to the third drive terminal, based on the fourth drive terminal; and a second pull-down transistor configured to couple the third drive terminal to the fourth drive terminal;

a transformer including a primary coil, and a first secondary coil and a second secondary coil;

an AC voltage generation circuit configured to generate an AC voltage, and apply the AC voltage to the primary coil;

a first rectifier circuit configured to rectify a voltage generated by the first secondary coil, and generate the first voltage in a first node based on a first reference node;

a second rectifier circuit configured to rectify an AC voltage generated by the second secondary coil, and generate the second voltage in a second node based on a second reference node, wherein the second reference node is coupled to the emitter of the low-side transistor and one end of the second pull-down transistor;

first wiring configured to couple the first reference node to the second drive terminal and one end of the first pull-down transistor;

second wiring configured to couple the first node to one end of the first pull-up transistor;

third wiring configured to couple the second reference node to the fourth drive terminal and one end of the second pull-down transistor; and fourth wiring configured to couple the second node to one end of the second pull-up transistor.

16. The drive device according to claim 15, wherein the wiring board further includes:

a first photocoupler configured to receive an input of a first PWM signal having a lower voltage level than the first voltage and the second voltage, convert the voltage level of the first PWM signal into a voltage level according to the first voltage, and control the high-side driver by using the converted PWM signal, and a second photocoupler configured to receive an input of a second PWM signal having a lower voltage level than the first voltage and the second voltage, convert the voltage level of the second PWM signal into a voltage level according to the second voltage, and control the low-side driver by using the converted PWM signal.

17. The drive device according to claim 16, wherein the wiring board includes a first wiring region, a second wiring region and a third wiring region insulated from each other, the first drive terminal and the second drive terminal, the high-side driver, and the first rectifier circuit are provided in the first wiring region, the third drive terminal and the fourth drive terminal, the low-side driver, and the second rectifier circuit are provided in the second wiring region, the AC voltage generation circuit is provided in the third wiring region, the transformer is provided between the third wiring region, and the first wiring region and the second wiring region, the first photocoupler is provided between the third wiring region and first wiring region, and the second photocoupler is provided between the third wiring region and the second wiring region.

18. The drive device according to claim 15, wherein each of the high-side transistor and the low-side transistor is an IGBT including:

a first trench gate electrode arranged in an active cell region, and electrically connected to a gate; and a second trench gate electrode and a third trench gate electrode, each of which is arranged at intervals on both sides of the first trench gate electrode, and electrically connected to an emitter in the active cell region.

19. The drive device according to claim 15, wherein the first drive terminal comprises a gate of the first pullup transistor of the high side driver;

wherein the second drive terminal comprises an emitter of the first pullup transistor of the high side driver;

wherein the third drive terminal comprises a gate of the second pullup transistor of the low side driver; and wherein the fourth drive terminal comprises an emitter of the second pullup transistor of the low side driver.

* * * * *